(12) United States Patent
Chen et al.

(10) Patent No.: US 12,278,551 B2
(45) Date of Patent: Apr. 15, 2025

(54) TRANS-INDUCTOR VOLTAGE REGULATOR CURRENT SENSING TECHNIQUES

(71) Applicant: Analog Devices, Inc., Wilmington, MA (US)

(72) Inventors: Xuebing Chen, San Jose, CA (US); Owen Jong, San Jose, CA (US); Ya Liu, Sunnyvale, CA (US); Jindong Zhang, San Jose, CA (US); Mark Frederick Hartman, Santa Clara, CA (US)

(73) Assignee: Analog Devices, Inc, Wilmington, MA (US)

( * ) Notice: Subject to any disclaimer, the term of this patent is extended or adjusted under 35 U.S.C. 154(b) by 320 days.

(21) Appl. No.: 17/711,680

(22) Filed: Apr. 1, 2022

(65) Prior Publication Data

US 2023/0318430 A1 Oct. 5, 2023

(51) Int. Cl.
*H02M 1/00* (2007.01)
*G01R 19/00* (2006.01)
*H02M 3/158* (2006.01)

(52) U.S. Cl.
CPC ...... *H02M 1/0009* (2021.05); *G01R 19/0092* (2013.01); *H02M 3/1584* (2013.01)

(58) Field of Classification Search
CPC ..... G05F 1/00; G05F 1/10; G05F 1/12; G05F 1/46; G05F 1/455; G05F 1/45;
(Continued)

(56) References Cited

U.S. PATENT DOCUMENTS 7,005,835 B2   2/2006   Brooks et al.
7,233,132 B1*  6/2007   Dong .................. H02M 3/1584
                                                    323/272
(Continued)

FOREIGN PATENT DOCUMENTS

CN   114123800 A    3/2022
CN   116896266 A   10/2023
(Continued)

OTHER PUBLICATIONS

"U.S. Appl. No. 17/714,937, Corrected Notice of Allowability mailed Apr. 3, 2024", 2 pgs.
(Continued)

*Primary Examiner* — Jeffrey A Gblende
(74) *Attorney, Agent, or Firm* — Schwegman Lundberg & Woessner, P.A.

(57) ABSTRACT

Several current sensing techniques are described that may be used to obtain an accurate current signal, which may help to achieve the best performance with a trans-inductor voltage regulator (TLVR) topology. The techniques may have the coupling effect from the secondary side included, so the current sensing signal is accurate for the regulation and other functions related to the current signal. The current sensing techniques may have more accurate gain and phase information in the middle frequency and high frequency ranges. The coupling effect from the secondary side may be well represented in the current sensing signal. The advantages of TLVR topology may be enhanced with accurate current information.

25 Claims, 25 Drawing Sheets

(58) Field of Classification Search
CPC ... G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/157; H02M 3/158; H02M 1/346; H02M 3/1588; H02M 2003/1566; H02M 3/1582; H02M 3/1584; H02M 2003/1557; H02M 1/0032; H02M 1/4225; H02M 7/217; H02M 1/0025; H02M 1/0045; H02M 1/0009; H05B 39/048; B23K 11/24; H04B 2215/069

See application file for complete search history.

(56) References Cited

U.S. PATENT DOCUMENTS

| | | | |
|---|---|---|---|
| 7,589,511 B2 | 9/2009 | Dong et al. | |
| 7,960,957 B2 * | 6/2011 | Clavette | H02M 3/157 323/272 |
| 8,044,650 B2 | 10/2011 | Tang et al. | |
| 8,120,346 B2 | 2/2012 | Ostrom et al. | |
| 8,502,515 B1 | 8/2013 | Wan et al. | |
| 8,823,352 B2 | 9/2014 | Zhang | |
| 9,037,884 B2 | 5/2015 | Rahardjo et al. | |
| 9,520,788 B2 | 12/2016 | Kobayashi | |
| 9,525,351 B2 | 12/2016 | Li et al. | |
| 9,627,969 B2 | 4/2017 | Tschirhart et al. | |
| 9,748,843 B2 | 8/2017 | Zhang et al. | |
| 10,084,381 B2 | 9/2018 | Zhang et al. | |
| 10,483,847 B2 | 11/2019 | Tang et al. | |
| 11,979,081 B2 | 5/2024 | Jong et al. | |
| 2008/0205098 A1 | 8/2008 | Xu et al. | |
| 2014/0002038 A1 | 1/2014 | Hsu | |
| 2016/0187386 A1 | 6/2016 | El-damak et al. | |
| 2022/0109368 A1 | 4/2022 | Zhou et al. | |
| 2022/0376600 A1 | 11/2022 | Jong et al. | |

FOREIGN PATENT DOCUMENTS

| | | |
|---|---|---|
| DE | 102023107696 A1 | 10/2023 |
| EP | 3979482 A1 | 4/2022 |

OTHER PUBLICATIONS

"U.S. Appl. No. 17/714,937, Non Final Office Action mailed Oct. 2, 2023", 11 pgs.

"U.S. Appl. No. 17/714,937, Response filed Dec. 22, 2023 to Non Final Office Action mailed Oct. 2, 2023", 13 pgs.

"U.S. Appl. No. 17/714,937, Notice of Allowance mailed Mar. 18, 2024", 9 pgs.

"Chinese Application Serial No. 202310344016.3, Office Action mailed May 8, 2023", w/o English translation, 1 pg.

"Chinese Application Serial No. 202310344016.3, Voluntary Amendment Filed Oct. 30, 2023", w/o English claims, 11 pgs.

"ISL6566: Three-Phase Buck PWM Controller with Integrated MOSFET Drivers for VRM9, VRM10, and AMD Hammer Applications", Intersil Data Sheet, (Mar. 9, 2006), 29 pgs.

"LTC3774: Dual, Multiphase Current Mode Synchronous Controller for Sub-Milliohm DCR Sensing", Linear Technology Data Sheet, (2013), 38 pgs.

"LTC3853: Triple Output, Multiphase Synchronous Step-Down Controller", Linear Technology Data Sheet, (2008), 36 pgs.

"LTC3882: Dual Output PolyPhase Step-Down DC/DC Voltage Mode Controller with Digital Power System Management", Linear Technology Data Sheet, (2014), 107 pgs.

"Multiphase Buck Voltage Mode DC/DC Controllers", Analog Devices Inc., [Online] Retrieved from the Internet: <URL: https://www.mouser.com/new/analog-devices/adi-multiphase-dc-dc-controllers/>, (Sep. 2, 2020), 3 pgs.

"VRD11/VRD10, K8 Rev F 2/3/4-Phase PWM Controllers with Integrated Dual MOSFET Drivers", Maxim Integrated Products, Inc., (2006), 50 pgs.

"ZL8801: Dual Phase PMBus ChargeMode Control DC/DC Digital Controller", Renesas Data Sheet, (Mar. 27, 2015), 87 pgs.

Dong, Yan, et al., "DCR Current Sensing Method for Achieving Adaptive Voltage Positioning (AVP) in Voltage Regulators with Coupled Inductors", 37th IEEE Power Electronics Specialists Conference, (2006), 5 pgs.

Hegarty, Timothy, "3D-Integrated MOSFETs With Ultra-Low DCR Inductor Provides High-Efficiency DC/DC Regulator", Power Electronics, [Online] Retrieved from the Internet: <URL: https://www.powerelectronics.com/technologies/discrete-power-semis/article/21861337/3dintegrated-mosfets-with-ultralow-dcr-inductor-provides-highefficiency-dcdc-regulator>, (Nov. 13, 2013), 22 pgs.

Hegde, Krishnamurthy, "TPS65311-Q1 BUCK1 Controller DCR Current Sensing", Texas Instruments Application Report SLVA791, (Sep. 2016), 9 pgs.

Oraw, Bradley, et al., "Lossless DCR Current Sensing for Multi-Winding Coupled Inductors", IEEE 30th International Telecommunications Energy Conference (INTELEC), (2008), 6 pgs.

Xu, Ming, et al., "Novel Coupled-Inductor Multi-phase VRs", 22nd Annual IEEE Applied Power Electronics Conference and Exposition (APEC), (2007), 113-119.

Zhang, Henry, et al., "Switch Mode Power Supply Current Sensing—Part 3: Current Sensing Methods", Analog Devices Technical Article, (2018), 4 pgs.

Zhu, Guangyong, et al., "Modeling and Design Considerations of Coupled Inductor Converters", 25h Annual IEEE Applied Power Electronics Conference and Exposition (APEC), (2010), 7 pgs.

"German Application Serial No. 102023107696.5, Office Action mailed Nov. 26, 2024", w/o English translation, 4 pgs.

Shao, Hang, et al., "Analytic Model and Design Procedure of the Single-Secondary Trans-Inductor Voltage Regulator", IEEE Energy Conversion Congress and Exposition (ECCE), (2021), 2005-2010.

Zhang, Nian, et al., "Analysis of Multi-Phase Trans-Inductor Voltage Regulator with Fast Transient Response for Large Load Current Applications", IEEE International Symposium on Circuits and Systems (ISCAS), (2021), 1-5.

* cited by examiner

TRANS-INDUCTOR VOLTAGE REGULATOR CURRENT SENSING TECHNIQUES

FIELD OF THE DISCLOSURE

This document pertains generally, but not by way of limitation, to power converter circuits.

BACKGROUND

One of the most common challenges in designing portable electronic devices is the generation and maintenance of a regulated voltage from an unregulated voltage source, such as a battery. Typically, a voltage regulator is used for this purpose. A voltage regulator may be designed as a linear regulator or a switching regulator.

A linear regulator provides closed loop control to regulate the voltage at the load. This type of regulator may be used to provide a constant output voltage that has a lower magnitude than the unregulated voltage source.

In contrast, a switching regulator uses an energy-storage element, such as an inductor, to transfer energy from the unregulated power source to the load in discrete bursts. Feedback circuitry may be used to regulate the energy transfer to maintain a constant voltage at the load. Because the switching regulator operates to transfer energy in discrete bursts, it may be configured to step-up or step-down the voltage of the unregulated voltage source. Moreover, switching regulators are generally more efficient than linear regulators.

Various types of switching regulators are commonly used today in portable electronic devices. A buck converter is an inductor-based regulator used to step-down or buck the unregulated voltage source. A boost converter is an inductor-based regulator used to step-up or boost the unregulated voltage source. In some applications, a buck-boost converter may be used to provide a regulated output that is higher, lower or the same as the unregulated voltage source.

Current-mode control may be used for switching regulators due to its high reliability, simple loop compensation design, and simple and reliable load sharing capability. The current sense signal may be an important part of a current-mode switch mode power supply design; it is used to regulate the output and also provides overcurrent protection.

SUMMARY OF THE DISCLOSURE

This disclosure describes several current sensing techniques that may be used to obtain an accurate current signal, which may help to achieve the best performance with a trans-inductor voltage regulator (TLVR) topology. The techniques may have the coupling effect from the secondary side included, so the current sensing signal is accurate for the regulation and other functions related to the current signal. The current sensing techniques may have more accurate gain and phase information in the middle frequency and high frequency ranges. The coupling effect from the secondary side may be well represented in the current sensing signal. The advantages of TLVR topology may be enhanced with accurate current information.

In some aspects, this disclosure is directed to a current sensing circuit for use with a multi-phase trans-inductor voltage regulator including N primary windings and linked secondary windings, the current sensing circuit comprising: a first circuit coupled to a first node, the first circuit configured to receive a first voltage that represents first current information through one of the N primary windings; a second circuit coupled to a second node, the second circuit configured to receive a second voltage that represents second current information through the secondary winding; and a control circuit to combine the first current information and the second current information to sense a current.

In some aspects, this disclosure is directed to a method of sensing current in a multi-phase trans-inductor voltage regulator, the multi-phase trans-inductor voltage regulator including N primary windings and linked secondary windings, the method comprising: receiving, using a first circuit coupled to a first node, a first voltage that represents first current information through one of the N primary windings; receiving, using a second circuit coupled to a second node, a second voltage that represents second current information through the secondary winding; and combining the first current information and the second current information to sense a current.

In some aspects, this disclosure is directed to a current sensing circuit for use with a multi-phase trans-inductor voltage regulator including N primary windings and linked secondary windings, the current sensing circuit comprising: means for receiving, using a first circuit coupled to a first node, a first voltage that represents first current information through one of the N primary windings; means for receiving, using a second circuit coupled to a second node, a second voltage that represents second current information through the secondary winding; and a control circuit to combine the first current information and the second current information to sense a current.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figures 1, 2:
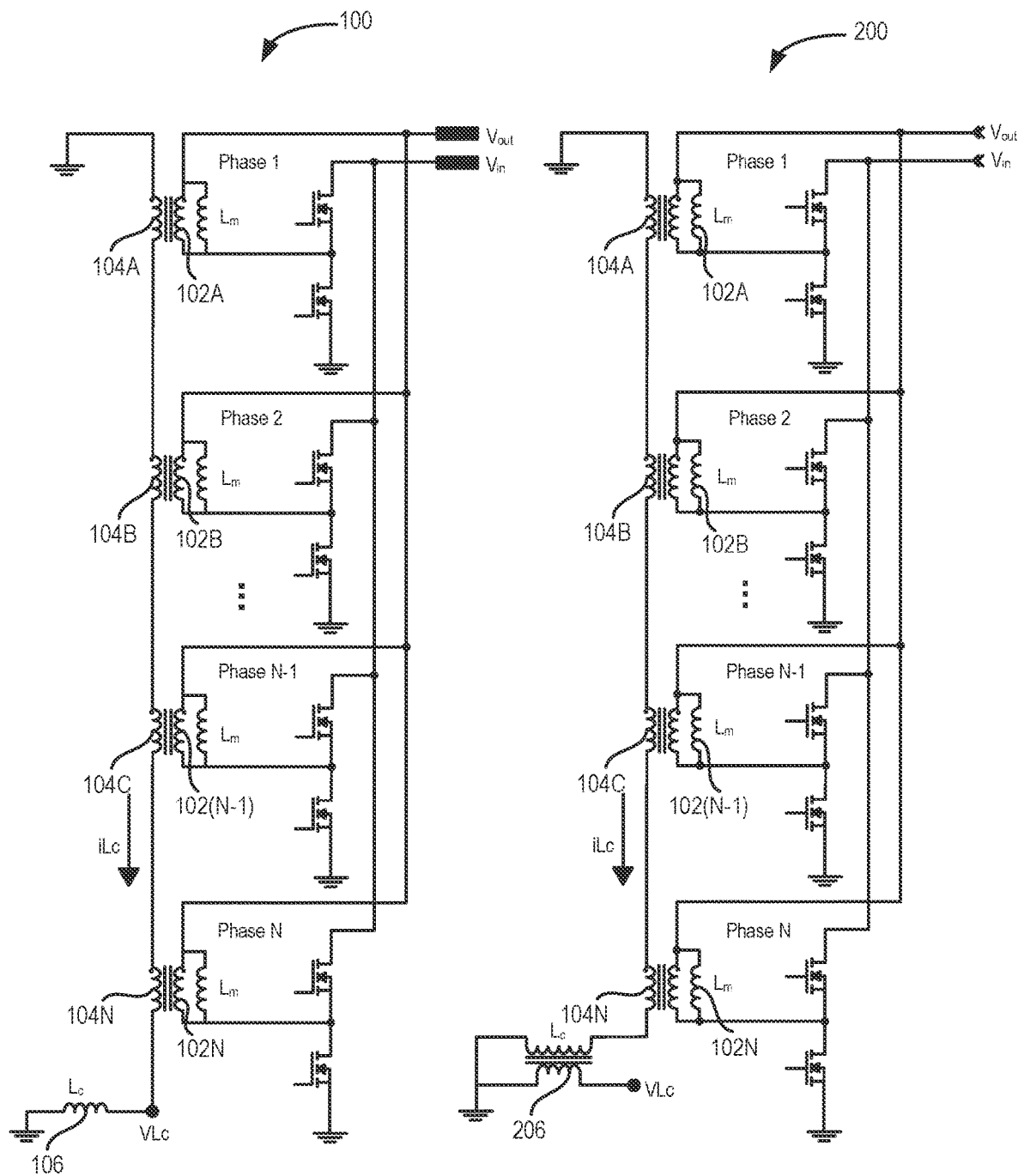
FIG. 1 is an example of a multi-phase trans-inductor voltage regulator.
FIG. 2 is another example of a multi-phase trans-inductor voltage regulator.

Current-mode control may be used for switching regulators due to its high reliability, simple loop compensation design, and simple and reliable load sharing capability. A current sense signal may be an important part of a current-mode switch mode power supply design because it is used to regulate the output and may also provide overcurrent protection. Current information that may be sensed include the peak inductor current, the valley inductor current (the minimum value of the inductor current when in continuous conduction mode), and the average output current.

In some switching regulator circuits, it may be desirable to utilize a multi-phase trans-inductor voltage regulator (TLVR) topology, rather than individual inductors, as energy-storage elements to transfer energy from the unregulated power source to the load in discrete bursts. The TLVR topology may help meet stringent requirements on steep load transients with fewer output capacitors, as compared with traditional multi-phase buck voltage regulators, for example. Accurate current information is important to output regulation, current sharing, overcurrent protection (OCP), and the like, for voltage regulator circuits.

In some approaches to current sensing, a sense resistor may be used. Although a sense resistor may provide great accuracy, these techniques may cause significant losses at heavy load.

In other approaches, inductor DC resistance (DCR) current sensing may be used. DCR current sensing uses the parasitic resistance of the inductor winding to measure current, thereby eliminating the sense resistor. This may reduce component costs and increase power supply efficiency. DCR sensing has distortion for gain and phase of sensing signal versus the actual current signal. It may cause the gain and phase to have distortion in the middle frequency and the high frequency ranges. DCR sensing may lose accurate middle frequency and high frequency current information that is desirable for loop compensation. As such, DCR sensing may not be as accurate as using a sense resistor.

Some voltage regulator circuits may include a power stage assembly, such as a driver FET (DrMOS) module. In some such approaches, the DrMOS sensing techniques may use a current monitor signal Imon plus the AC injection from the switch node of the voltage regulator. DrMOS sensing techniques may cause the gain and phase to have distortion in the middle frequency and the high frequency ranges. DrMOS sensing techniques may lose accurate middle frequency and high frequency current information that is desirable for loop compensation. At higher frequency, these DrMOS sensing techniques may not be sufficiently accurate for TLVR topology, where higher frequency harmonic information is desirable.

The present inventors have recognized a need for an accurate current sensing technique for a TLVR topology in switching regulator circuits, where the current sensing technique may provide the current information needed for a power converter design. This disclosure describes several current sensing techniques that may be used to obtain an accurate current signal, which may help to achieve the best performance with a TLVR topology. The proposed techniques may have the coupling effect from the secondary side included, so the current sensing signal is accurate for the regulation and other functions related to the current signal.

The proposed current sensing techniques may have more accurate gain and phase information in the middle frequency and high frequency ranges. The coupling effect from the secondary side may be well represented in the current sensing signal. As such, there may be no significant distortion of closed-loop gain and phase, in contrast to other current sensing approaches. The advantages of TLVR topology may be enhanced with accurate current information.

FIG. 1 is an example of a multi-phase trans-inductor voltage regulator. The TLVR 100 of FIG. 1 is an N-phase single-secondary TLVR. The TLVR 100 may include a primary side having N primary windings 102A-102N and a secondary side including corresponding linked secondary windings 104A-104N. An inductor Lc 106 may be included on the secondary side. In the example shown in FIG. 1, the inductor Lc 106 may be a discrete inductor. Using various techniques of this disclosure, the current iLc through the inductor Lc 106 may be accurately sensed and applied to a control circuit, which determine information about the current, such as peak current, valley current, and intermediate ripples.

FIG. 2 is another example of a multi-phase trans-inductor voltage regulator. The TLVR 200 of FIG. 2 is an N-phase single-secondary TLVR. Like, the TLVR 100 of FIG. 1, the TLVR 200 may include a primary side having N primary windings 102A-102N and a secondary side including corresponding linked secondary windings 104A-104N. In FIG. 2, the inductor Lc of FIG. 1, e.g., a discrete inductor, may be replaced with a transformer 206 on the secondary side. Using various techniques of this disclosure, the current iLc through the transformer 206 may be accurately sensed and applied to a control circuit, which determine information about the current, such as peak current, valley current, and intermediate ripples.

This disclosure describes, in general, two main categories of current sensing techniques for TLVR topologies: 1) secondary-side injection techniques that may capture higher frequency harmonic information through the secondary side of the TLVR; and 2) primary-side injection techniques. The secondary-side injection techniques will be described first, followed by a description of the primary-side injection techniques. Generally speaking, the techniques for sensing current in a multi-phase trans-inductor voltage regulator, which includes N primary windings and linked secondary windings, may include: receiving, using a first circuit coupled to a first node, a first voltage that represents first current information through one of the N primary windings; receiving, using a second circuit coupled to a second node, a second voltage that represents second current information through the secondary winding; and combining the first current information and the second current information to sense a current. In some examples, a control circuit may determine whether a transient condition or a failure condition is present based on the combined information.

Figure 3:
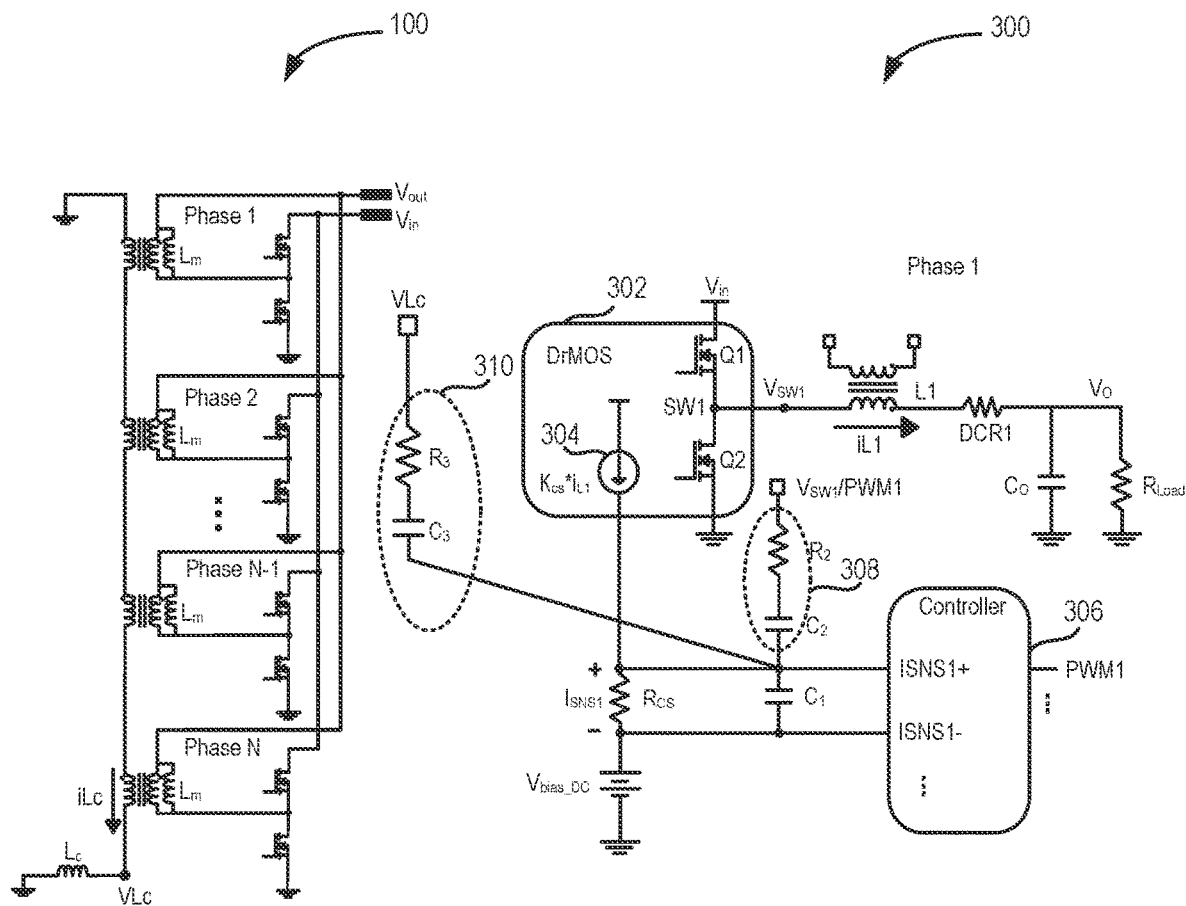
FIG. 3 is an example of a current sensing circuit for use with a multi-phase TLVR voltage regulator, in accordance with various techniques of this disclosure.

FIG. 3 is an example of a current sensing circuit for use with a multi-phase TLVR voltage regulator 100, in accordance with various techniques of this disclosure. The current sensing circuit 300 of FIG. 3 may be used along with a power stage assembly 302, such as a driver FET (DrMOS) module, which may be coupled to an input voltage $V_{IN}$, to sense currents of the TLVR 100. An output voltage $V_O$ is generated across a load having a resistance RLOAD and capacitance $C_O$.

The power stage assembly 302 may include a switching circuit including a first switching element Q1 and a second switching element Q2. A first winding of an inductor L1 may be coupled to a switching node SW1 between the first switching element Q1 and the second switching element Q2. The inductor L1 represents one of the primary windings of the TLVR 100, such as the primary winding 102A in FIG. 1.

The first power stage assembly 302 may also include a signal source 304. The signal source 304 may output a first representation of a current through the inductor L1, where the representation includes a DC component of the current through the inductor L1. For example, the signal source 304 may output a representation of the current through the inductor L1, where the representation is a scaling factor K multiplied by the inductor current $i_{L1}$ through the inductor L1 ($K \times i_{L1}$). The DC component of the current is achieved by $(K \times i_{L1}) \times R_{CS}$, with the capacitor C1 acting as a filter for $(K \times i_{L1}) \times R_{CS}$. A control circuit 306, e.g., a multi-phase controller, may receive the representation of the current via a node ISNS1−.

The current sensing circuit 300 may include a first circuit 308 coupled to either the switching node SW1 or to the output node PWM1 of the control circuit 306. The first circuit 308 may be a passive network including resistor R2 and capacitor C2, which are coupled in series. The first circuit 308 may be coupled to node ISNS1+, which may be an input to the control circuit 306, such that the control circuit 306 receives a first voltage that represents first current information, e.g., a representation of current iL1 through the inductor L1, which is one of the N primary windings of the TLVR 100. The first current information may include the AC component of the inductor current iL1.

The current sensing circuit 300 may include a second circuit 310 coupled to receive the voltage at node VLC, which is coupled to the inductor Lc of the TLVR. The second circuit 310 may be a passive network including resistor R3 and capacitor C3, which are coupled in series. The second circuit 310 may be coupled to node ISNS1+, which may be an input to the control circuit 306, such that the control circuit 306 receives a second voltage that represents second current information, e.g., a representation of current iLc through the inductor Lc, which is one of the linked secondary windings of the TLVR 100. The second current information may include the AC component of the inductor current iLc. The control circuit 306 may receive and combine the first current information and the second current information to sense a current, such as to determine information about the inductor current iL1 and the inductor current iLc, such as peak current, valley current, and intermediate ripples.

It should be noted that the current sensing circuit 300 in FIG. 3 may be used to sense the current for one phase of the multi-phase TLVR voltage regulator 100. The coupling iLC current information from the secondary side for other phases may be similarly obtained by circuits similar to the first and second circuits 308, 310, which may be input into the control circuit 306 using separate inputs.

In addition, although the disclosure refers specifically to resistors and capacitors, the term resistor includes resistive components generally and the term capacitor includes capacitive components generally.

In some examples, the inductor Lc in FIG. 3 can be replaced by a transformer, such as the transformer 206 shown in FIG. 2.

Figure 4:
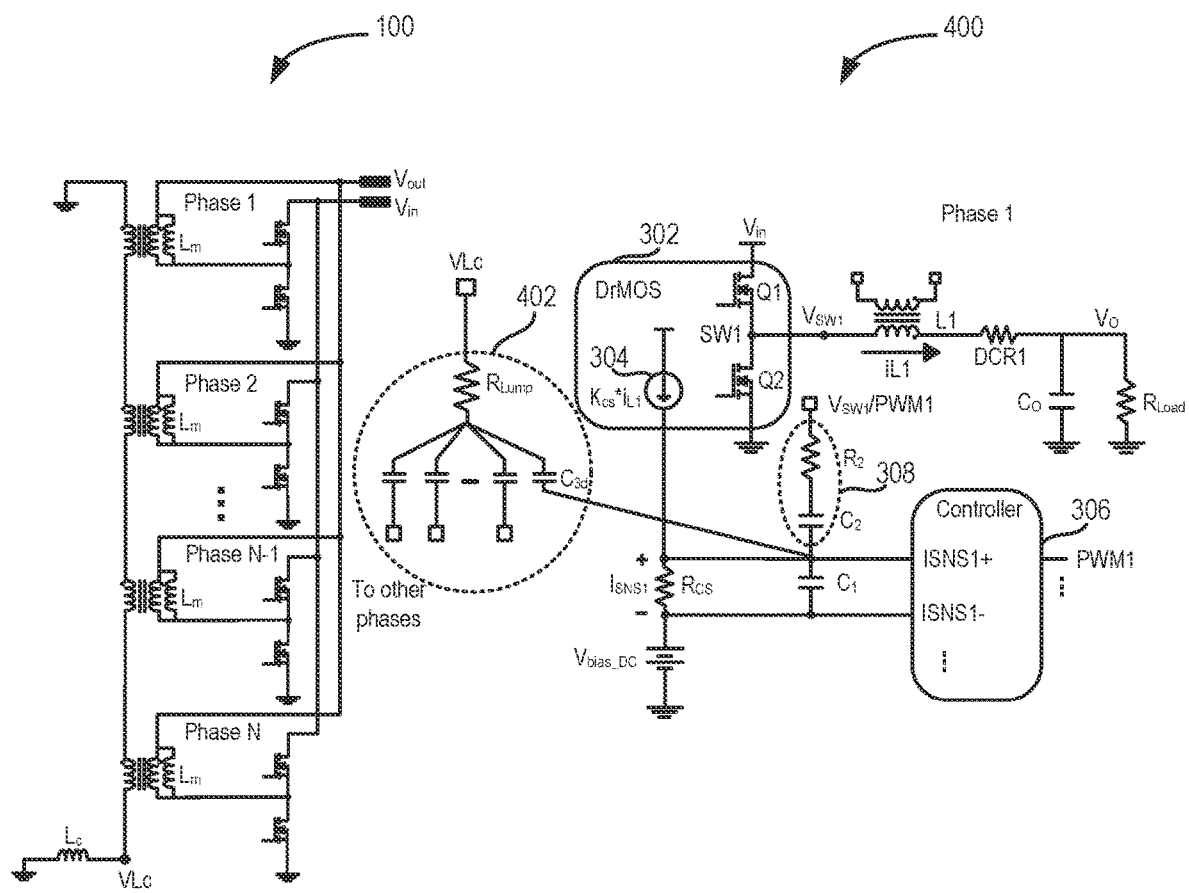
FIG. 4 is another example of a current sensing circuit for use with a multi-phase TLVR voltage regulator, in accordance with various techniques of this disclosure.

FIG. 4 is another example of a current sensing circuit for use with a multi-phase TLVR voltage regulator 100, in accordance with various techniques of this disclosure. Many of the components in FIG. 4 are similar to those in FIG. 3 and, for purposes of conciseness, will not be described in detail.

The current sensing circuit 400 may include a first circuit 308 coupled to either the switching node SW1 or to the output node PWM1 of the control circuit 306. The first circuit 308 may be a passive network including resistor R2 and capacitor C2, which are coupled in series. The first circuit 308 may be coupled to node ISNS1+, which may be an input to the control circuit 306, such that the control circuit 306 receives a first voltage that represents first current information, e.g., a representation of current $i_{L1}$ through the inductor L1, which is one of the N primary windings of the TLVR 100. The first current information may include the AC component of the inductor current $i_{L1}$.

In contrast to the second circuit 310 of FIG. 3, the current sensing circuit 400 of FIG. 4 includes a second circuit 402 having a resistor $R_{LUMP}$ coupled in series with a plurality of parallel-connected second capacitors C3. With respect to FIG. 3, each phase of the multi-phase TLVR voltage regulator 100 uses a corresponding second circuit 310. With the configuration in FIG. 4, however, one resistor $R_{LUMP}$ may be shared for each RC branch of the secondary side with other phases using a corresponding capacitor C3.

The second circuit 402 may be coupled to receive the voltage at node VLC, which is coupled to the inductor Lc of the TLVR. The second circuit 402 may be coupled to node ISNS1+, which may be an input to the control circuit 306, such that the control circuit 306 receives a second voltage that represents second current information, e.g., a representation of current iLc through the inductor Lc, which is one of the linked secondary windings of the TLVR 100. The second current information may include the AC component of the inductor current iLc. The control circuit 306 may receive and combine the first current information and the second current information to sense a current, such as to determine information about the inductor current iL1 and the inductor current iLc, such as peak current, valley current, and intermediate ripples.

In some examples, the inductor Lc in FIG. 4 can be replaced by a transformer, such as the transformer 206 shown in FIG. 2.

Figure 5:
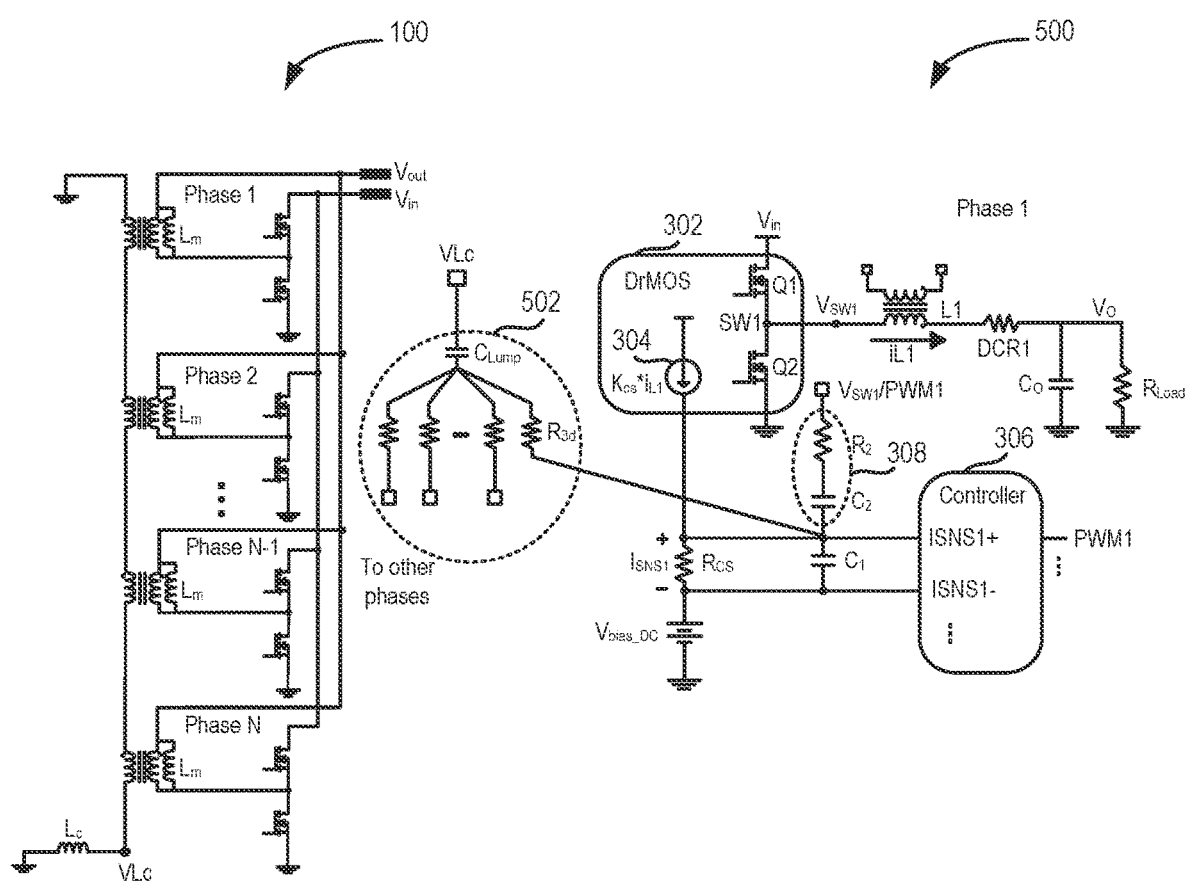
FIG. 5 is another example of a current sensing circuit for use with a multi-phase TLVR voltage regulator, in accordance with various techniques of this disclosure.

FIG. 5 is another example of a current sensing circuit 500 for use with a multi-phase TLVR voltage regulator 100, in accordance with various techniques of this disclosure. Many of the components in FIG. 5 are similar to those in FIG. 3 and, for purposes of conciseness, will not be described in detail.

The current sensing circuit 500 may include a first circuit 308 coupled to either the switching node SW1 or to the output node PWM1 of the control circuit 306. The first circuit 308 may be a passive network including resistor R2 and capacitor C2, which are coupled in series. The first circuit 308 may be coupled to node ISNS1+, which may be an input to the control circuit 306, such that the control circuit 306 receives a first voltage that represents first current information, e.g., a representation of current iL1 through the inductor L1, which is one of the N primary windings of the TLVR 100. The first current information may include the AC component of the inductor current iL1.

In contrast to the second circuit 310 of FIG. 3, the current sensing circuit 500 of FIG. 4 includes a second circuit 502 having a capacitor $C_{LUMP}$ coupled in series with a plurality of parallel-connected second resistors R3. With respect to FIG. 3, each phase of the multi-phase TLVR voltage regulator 100 uses a corresponding second circuit 310. With the configuration in FIG. 5, however, one capacitor $C_{LUMP}$ may be shared for each RC branch of the secondary side with other phases using a corresponding resistor R3.

The second circuit 502 may be coupled to receive the voltage at node VLC, which is coupled to the inductor Lc of the TLVR. The second circuit 502 may be coupled to node ISNS1+, which may be an input to the control circuit 306, such that the control circuit 306 receives a second voltage that represents second current information, e.g., a representation of current iLc through the inductor Lc, which is one of the linked secondary windings of the TLVR 100. The second current information may include the AC component of the inductor current iLc. The control circuit 306 may receive and combine the first current information and the second current information to sense a current, such as to determine information about the inductor current iL1 and the inductor current iLc, such as peak current, valley current, and intermediate ripples.

In some examples, the inductor Lc in FIG. 5 can be replaced by a transformer, such as the transformer 206 shown in FIG. 2.

Figure 6:
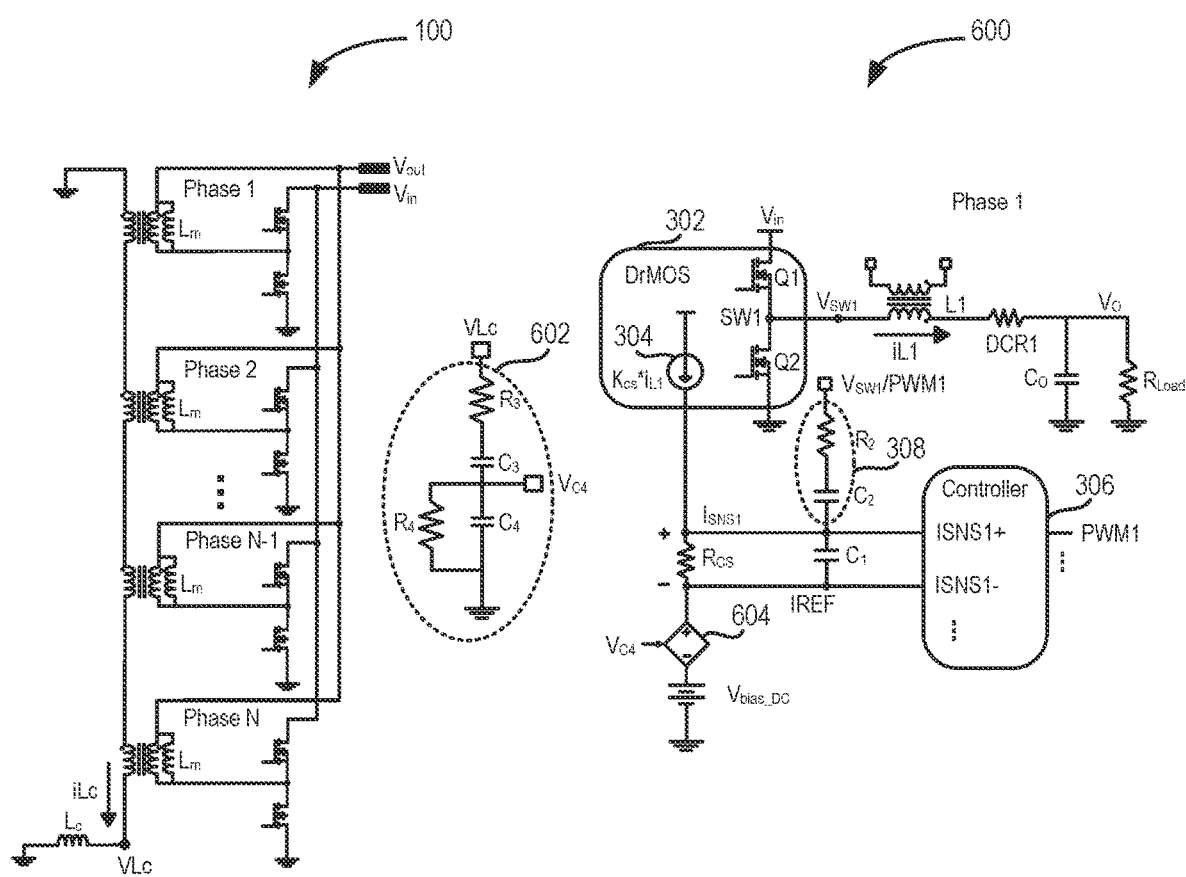
FIG. 6 is another example of a current sensing circuit for use with a multi-phase TLVR voltage regulator, in accordance with various techniques of this disclosure.

FIG. 6 is another example of a current sensing circuit 600 for use with a multi-phase TLVR voltage regulator 100, in accordance with various techniques of this disclosure. Many of the components in FIG. 6 are similar to those in FIG. 3 and, for purposes of conciseness, will not be described in detail.

The current sensing circuit 600 may include a first circuit 308 coupled to either the switching node SW1 or to the output node PWM1 of the control circuit 306. The first circuit 308 may be a passive network including resistor R2 and capacitor C2, which are coupled in series. The first circuit 308 may be coupled to node ISNS1+, which may be an input to the control circuit 306, such that the control circuit 306 receives a first voltage that represents first current information, e.g., a representation of current iL1 through the inductor L1, which is one of the N primary windings of the TLVR 100. The first current information may include the AC component of the inductor current iL1.

The current sensing circuit 600 of FIG. 4 includes a second circuit having an RC network 602 coupled to a voltage-controlled voltage source (VCVS) 604. The RC network 602 may be coupled to receive the voltage at node VLC, which is coupled to the inductor Lc of the TLVR. The RC network 602 outputs a voltage VC4 that is applied to the VCVS 604.

The voltage from the VCVS 604 is a reference voltage that may be shared by each phase of the multi-phase TLVR voltage regulator 100. Only one RC network is used from the secondary side of the multi-phase TLVR voltage regulator 100 to obtain the voltage VC4.

As seen in FIG. 6, the VCVS 604 may be added to a bias voltage Vbias_DC and coupled to node ISNS1−, which may be an input to the control circuit 306, such that the control circuit 306 receives a second voltage that represents second current information, e.g., a representation of current iLc through the inductor Lc, which is one of the linked secondary windings of the TLVR 100. The second current information may include the AC component of the inductor current iLc. The control circuit 306 may receive and combine the first current information and the second current information to sense a current, such as to determine information about the inductor current iL1 and the inductor current iLc, such as peak current, valley current, and intermediate ripples.

In some examples, the inductor Lc in FIG. 6 can be replaced by a transformer, such as the transformer 206 shown in FIG. 2.

Figure 7:
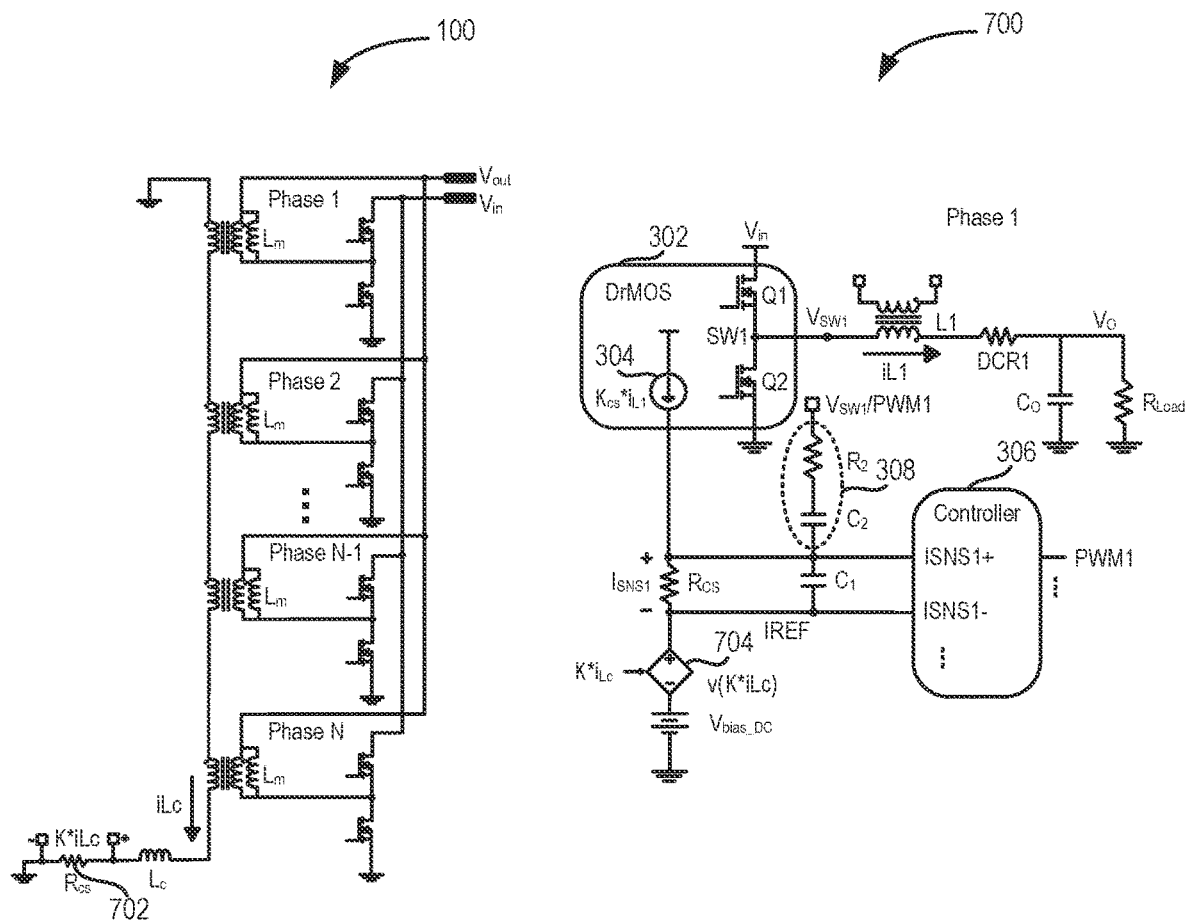
FIG. 7 is another example of a current sensing circuit for use with a multi-phase TLVR voltage regulator, in accordance with various techniques of this disclosure.

FIG. 7 is another example of a current sensing circuit 700 for use with a multi-phase TLVR voltage regulator 100, in accordance with various techniques of this disclosure. Many of the components in FIG. 7 are similar to those in FIG. 3 and, for purposes of conciseness, will not be described in detail.

The current sensing circuit 700 may include a first circuit 308 coupled to either the switching node SW1 or to the output node PWM1 of the control circuit 306. The first circuit 308 may be a passive network including resistor R2 and capacitor C2, which are coupled in series. The first circuit 308 may be coupled to node ISNS1+, which may be an input to the control circuit 306, such that the control circuit 306 receives a first voltage that represents first current information, e.g., a representation of current iL1 through the inductor L1, which is one of the N primary windings of the TLVR 100. The first current information may include the AC component of the inductor current iL1.

In FIG. 7, a sense resistor 702 is coupled in series with the inductor Lc. The current iLc through the linked secondary windings of the TLVR generates a voltage K*iLc across the sense resistor 702, where K is a gain of the iLC and corresponds to the resistance of the sense resistor 702.

The voltage K*iLc generated across the sense resistor 702 may be applied to a second circuit 704, such as including a voltage-controlled voltage source. The voltage from the second circuit 704 is a reference voltage that may be shared by each phase of the multi-phase TLVR voltage regulator 100. The reference voltage is the sum of the bias voltage Vbias_dc+v(K*iLc).

As seen in FIG. 7, the second circuit 704 may be coupled to node ISNS1−, which may be an input to the control circuit 306, such that the control circuit 306 receives a second voltage that represents second current information, e.g., a representation of current iLc through the inductor Lc, which is one of the linked secondary windings of the TLVR 100. The second current information may include the AC component of the inductor current iLc. The control circuit 306 may receive and combine the first current information and the second current information to sense a current, such as to determine information about the inductor current iL1 and the inductor current iLc, such as peak current, valley current, and intermediate ripples.

Figure 8:
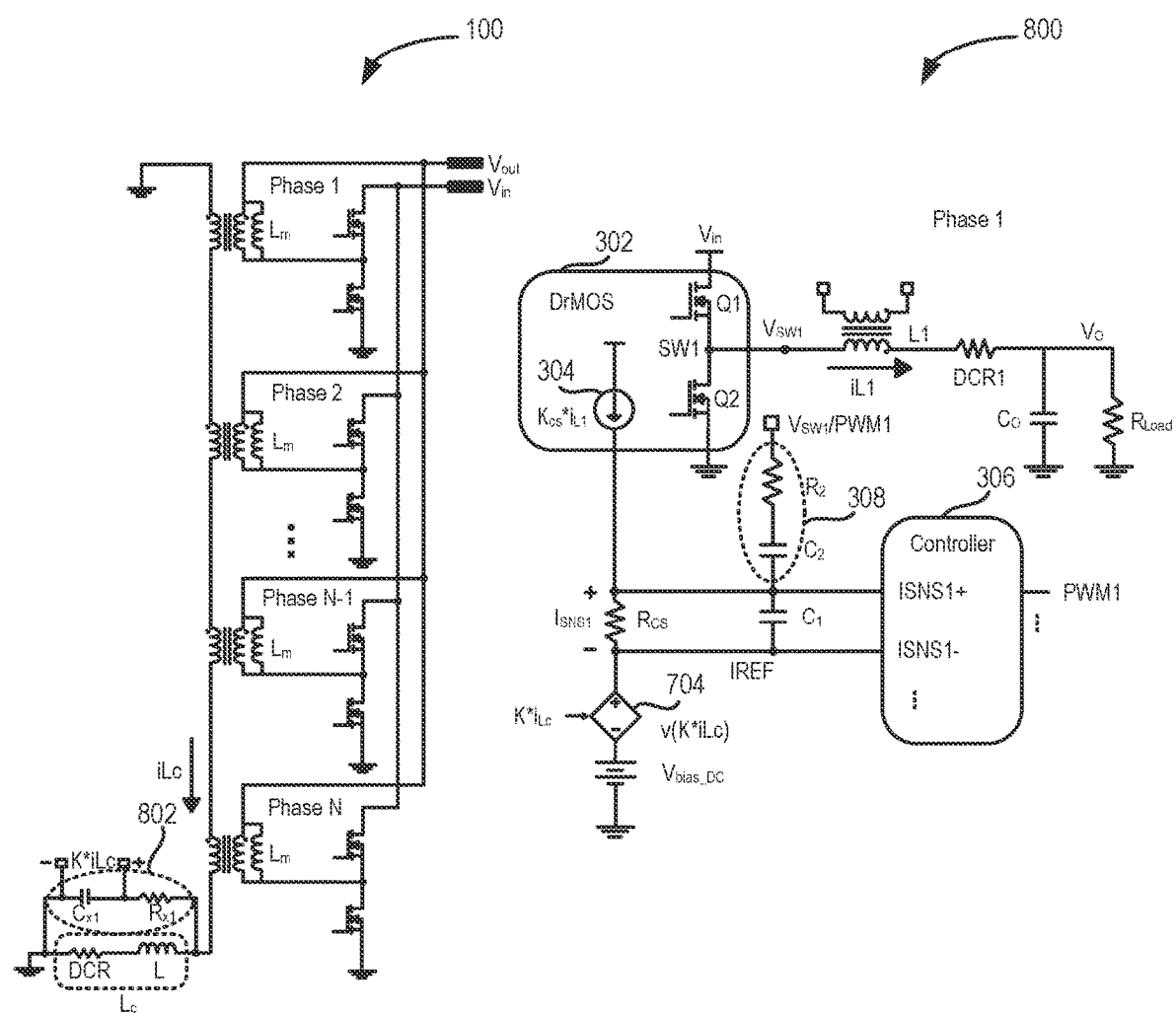
FIG. 8 is another example of a current sensing circuit for use with a multi-phase TLVR voltage regulator, in accordance with various techniques of this disclosure.

FIG. 8 is another example of a current sensing circuit 800 for use with a multi-phase TLVR voltage regulator 100, in accordance with various techniques of this disclosure. Many of the components in FIG. 8 are similar to those in FIG. 3 and, for purposes of conciseness, will not be described in detail.

The current sensing circuit 800 may include a first circuit 308 coupled to either the switching node SW1 or to the output node PWM1 of the control circuit 306. The first circuit 308 may be a passive network including resistor R2 and capacitor C2, which are coupled in series. The first circuit 308 may be coupled to node ISNS1+, which may be an input to the control circuit 306, such that the control circuit 306 receives a first voltage that represents first current information, e.g., a representation of current iL1 through the inductor L1, which is one of the N primary windings of the TLVR 100. The first current information may include the AC component of the inductor current iL1.

In FIG. 8, the inductor Lc is shown as including an inductance L in series with the inductor's DC resistance (DCR). Using the techniques of FIG. 8, an RC network 802 including a resistor RX1 and a capacitor CX1 are coupled in parallel with the linked secondary windings of the TLVR 100. The current iLc through the linked secondary windings of the TLVR generates a voltage K*iLc across the capacitor CX1 of the RC network 802, where K is a gain of the iLC and corresponds to the resistance of the resistor RX1.

The voltage K*iLc generated across the capacitor CX1 of the RC network 802 may be applied to a second circuit 704, such as including a voltage-controlled voltage source. The voltage from the second circuit 704 is a reference voltage that may be shared by each phase of the multi-phase TLVR voltage regulator 100. The reference voltage IREF is the sum of the bias voltage Vbias_dc+v(K*iLc).

As seen in FIG. 8, the second circuit 704 may be coupled to node ISNS1−, which may be an input to the control circuit 306, such that the control circuit 306 receives a second voltage that represents second current information, e.g., a representation of current iLc through the inductor Lc, which is one of the linked secondary windings of the TLVR 100. The second current information may include the AC component of the inductor current iLc. The control circuit 306 may receive and combine the first current information and the second current information to sense a current, such as to determine information about the inductor current iL1 and the inductor current iLc, such as peak current, valley current, and intermediate ripples.

Figure 9:
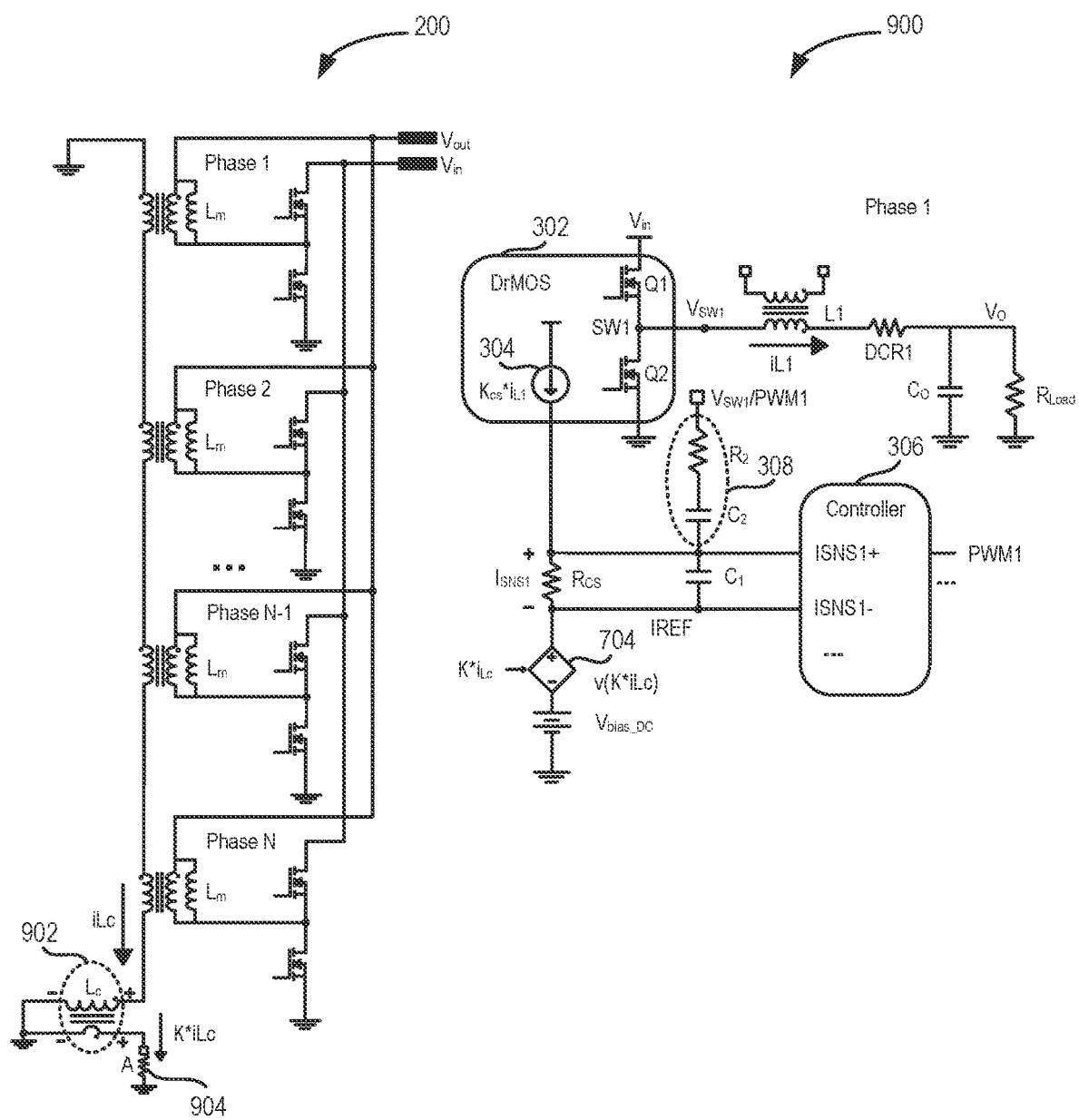
FIG. 9 is another example of a current sensing circuit for use with a multi-phase TLVR voltage regulator, in accordance with various techniques of this disclosure.

FIG. 9 is an example of a current sensing circuit 800 for use with a multi-phase TLVR voltage regulator 200, in accordance with various techniques of this disclosure. Many of the components in FIG. 9 are similar to those in FIG. 3 and, for purposes of conciseness, will not be described in detail.

The current sensing circuit 900 may include a first circuit 308 coupled to either the switching node SW1 or to the output node PWM1 of the control circuit 306. The first circuit 308 may be a passive network including resistor R2 and capacitor C2, which are coupled in series. The first circuit 308 may be coupled to node ISNS1+, which may be an input to the control circuit 306, such that the control circuit 306 receives a first voltage that represents first current information, e.g., a representation of current iL1 through the inductor L1, which is one of the N primary windings of the TLVR 200. The first current information may include the AC component of the inductor current iL1.

In FIG. 9, the inductor Lc includes a primary winding of a transformer 902, where the transformer 902 replaces the discrete inductor Lc of the TLVR 100 of FIG. 1. Using the techniques of FIG. 9, a resistor 904 may be coupled to a secondary winding of the transformer 920. The current iLc through the linked secondary windings of the TLVR generates a voltage K*iLc across the resistor 904, where K is a gain of the iLC and corresponds to the resistance of the resistor 904.

The voltage K*iLc generated across the resistor 904 may be applied to a second circuit 704, such as including a voltage-controlled voltage source. The voltage from the second circuit 704 is a reference voltage that may be shared by each phase of the multi-phase TLVR voltage regulator 200. The reference voltage is the sum of the bias voltage Vbias_dc+v(K*iLc).

As seen in FIG. 9, the second circuit 704 may be coupled to node ISNS1−, which may be an input to the control circuit 306, such that the control circuit 306 receives a second voltage that represents second current information, e.g., a representation of current iLc through the inductor Lc, which is one of the linked secondary windings of the TLVR 200. The second current information may include the AC component of the inductor current iLc. The control circuit 306 may receive and combine the first current information and the second current information to sense a current, such as to determine information about the inductor current iL1 and the inductor current iLc, such as peak current, valley current, and intermediate ripples.

Figure 10:
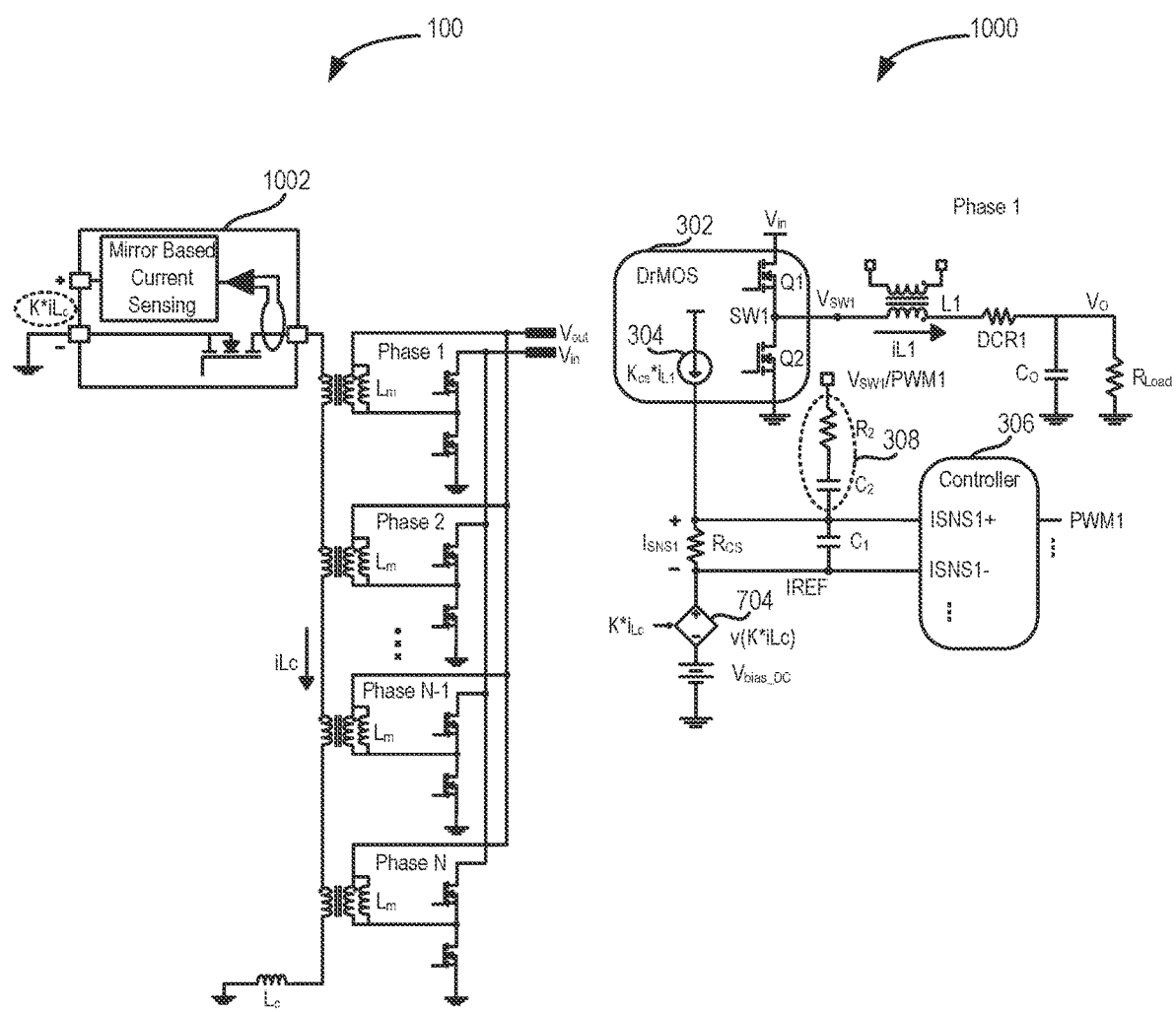
FIG. 10 is another example of a current sensing circuit for use with a multi-phase TLVR voltage regulator, in accordance with various techniques of this disclosure.

FIG. 10 is another example of a current sensing circuit 1000 for use with a multi-phase TLVR voltage regulator 100, in accordance with various techniques of this disclosure. Many of the components in FIG. 10 are similar to those in FIG. 3 and, for purposes of conciseness, will not be described in detail.

The current sensing circuit 1000 may include a first circuit 308 coupled to either the switching node SW1 or to the output node PWM1 of the control circuit 306. The first circuit 308 may be a passive network including resistor R2 and capacitor C2, which are coupled in series. The first circuit 308 may be coupled to node ISNS1+, which may be an input to the control circuit 306, such that the control circuit 306 receives a first voltage that represents first current information, e.g., a representation of current iL1 through the inductor L1, which is one of the N primary windings of the TLVR 200. The first current information may include the AC component of the inductor current iL1.

In FIG. 10, current mirror circuitry 1002 may be coupled to the linked secondary windings of the TLVR 100 to generate a representation of the second current information through the linked secondary windings. Using the techniques of FIG. 10, the current iLc through the linked secondary windings of the TLVR generates a voltage K*iLc at the output of the current mirror circuitry 1002, where K is a gain of the iLC and corresponds to a scaling of the current mirror circuitry 1002.

The voltage K*iLc generated at the output of the current mirror circuitry 1002 may be applied to a second circuit 704, such as including a voltage-controlled voltage source. The voltage from the second circuit 704 is a reference voltage that may be shared by each phase of the multi-phase TLVR voltage regulator 100. The reference voltage is the sum of the bias voltage Vbias_dc+v(K*iLc).

As seen in FIG. 10, the second circuit 704 may be coupled to node ISNS1−, which may be an input to the control circuit 306, such that the control circuit 306 receives a second voltage that represents second current information, e.g., a representation of current iLc through the inductor Lc, which is one of the linked secondary windings of the TLVR 100. The second current information may include the AC component of the inductor current iLc. The control circuit 306 may receive and combine the first current information and the second current information to sense a current, such as to determine information about the inductor current $i_{L1}$ and the inductor current iLc, such as peak current, valley current, and intermediate ripples.

Figure 11:
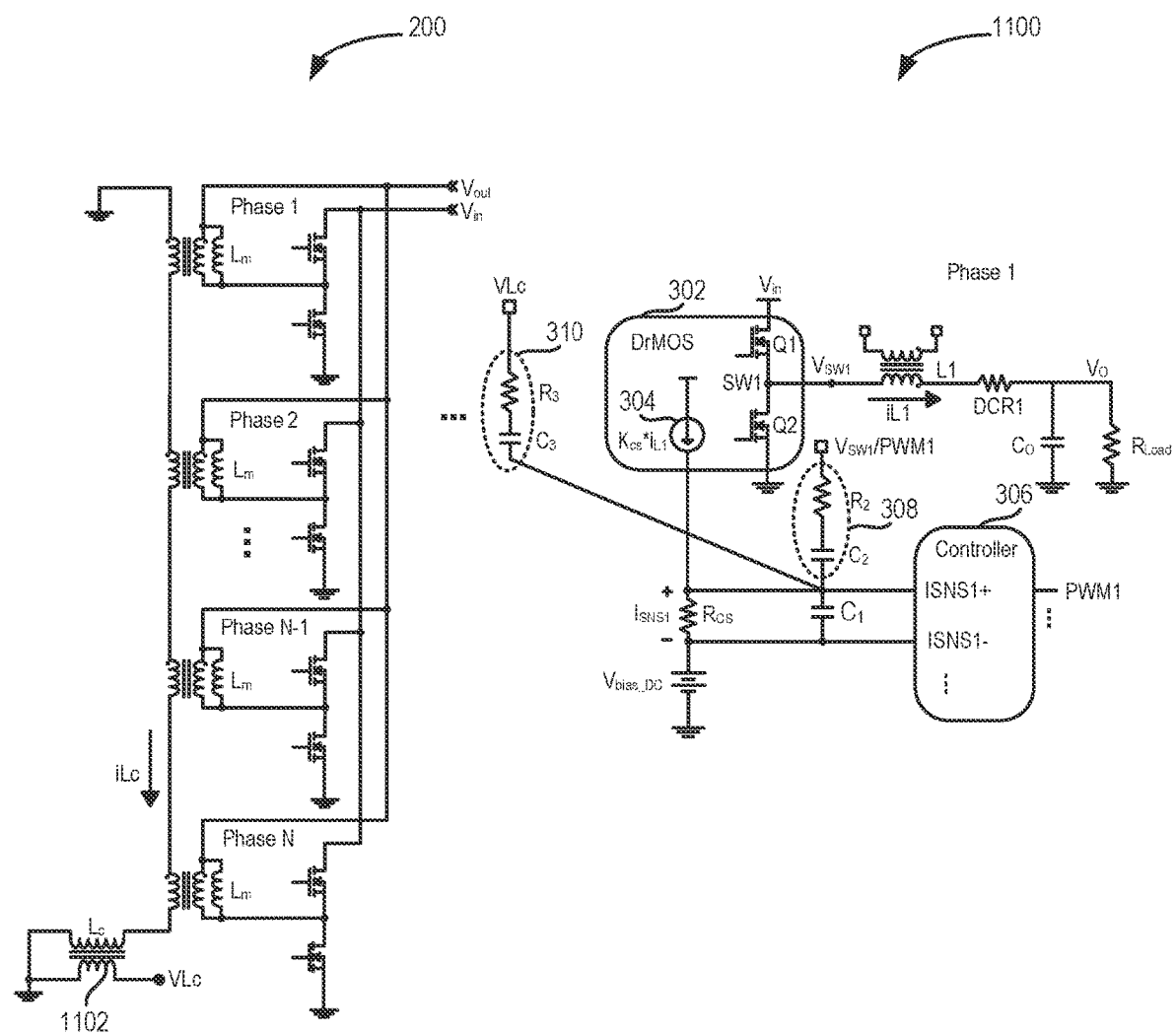
FIG. 11 is another example of a current sensing circuit for use with a multi-phase TLVR voltage regulator, in accordance with various techniques of this disclosure.

FIG. 11 is an example of a current sensing circuit 1100 for use with a multi-phase TLVR voltage regulator 200, in accordance with various techniques of this disclosure. Many of the components in FIG. 11 are similar to those in FIG. 3 and, for purposes of conciseness, will not be described in detail.

The current sensing circuit 1100 may include a first circuit 308 coupled to either the switching node SW1 or to the output node PWM1 of the control circuit 306. The first circuit 308 may be a passive network including resistor R2 and capacitor C2, which are coupled in series. The first circuit 308 may be coupled to node ISNS1+, which may be an input to the control circuit 306, such that the control circuit 306 receives a first voltage that represents first current information, e.g., a representation of current iL1 through the inductor L1, which is one of the N primary windings of the TLVR 200. The first current information may include the AC component of the inductor current iL1.

In FIG. 11, the linked secondary windings of the TLVR 200 includes a primary winding of a transformer 1102, where the transformer 1102 replaces the discrete inductor Lc of the TLVR 100 of FIG. 1.

The current sensing circuit 300 may include a second circuit 310 coupled to receive the voltage at node VLC, which is coupled to the secondary winding of the transformer 1102. The second circuit 310 may be a passive network including resistor R3 and capacitor C3, which are coupled in series. The second circuit 310 may be coupled to node ISNS1+, which may be an input to the control circuit 306, such that the control circuit 306 receives a second voltage that represents second current information, e.g., a representation of current iLc through the inductor Lc, which is one of the linked secondary windings of the TLVR 200. The second current information may include the AC component of the inductor current iLc. The control circuit 306 may receive and combine the first current information and the second current information to sense a current, such as to determine information about the inductor current iL1 and the inductor current iLc, such as peak current, valley current, and intermediate ripples.

It should be noted that the current sensing circuit 300 in FIG. 3 may be used to sense the current for one phase of the multi-phase TLVR voltage regulator 200. The coupling iLC current information from the secondary side for other phases may be similarly obtained by circuits similar to the first and second circuits 308, 310, which may be input into the control circuit 306 using separate inputs.

The techniques described above with respect to FIGS. 3-11 were directed to TLVR current sensing methods based on the secondary side iLc current. The techniques described below with respect to FIGS. 12-19 are directed to TLVR current sensing methods based on the primary-side inductor DCR.

Figure 12:
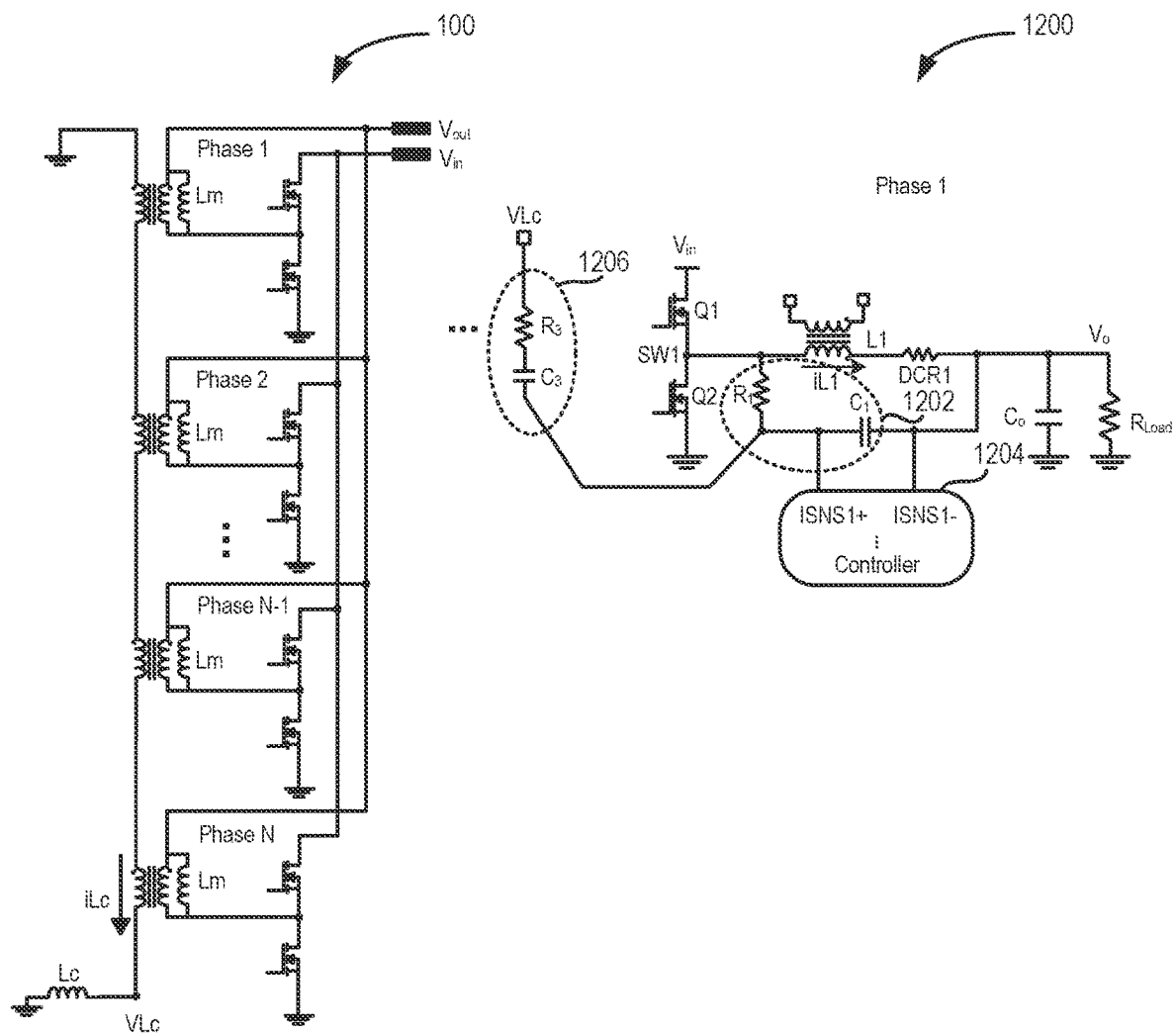
FIG. 12 is another example of a current sensing circuit for use with a multi-phase TLVR voltage regulator, in accordance with various techniques of this disclosure.

FIG. 12 is another example of a current sensing circuit for use with a multi-phase TLVR voltage regulator 100, in accordance with various techniques of this disclosure. The current sensing circuit 1200 of FIG. 12 may be used along with a switching circuit including a first switching element Q1 and a second switching element Q2, where the switching circuit is coupled to an input voltage $V_{IN}$. An output voltage $V_O$ is generated across a load including a resistance RLOAD and a capacitance $C_O$.

A first winding of an inductor L1 may be coupled to a switching node SW1 between the first switching element Q1 and the second switching element Q2. The inductor L1 represents one of the primary windings of the TLVR 100, such as the primary winding 102A in FIG. 1.

The current sensing circuit 1200 may include a first circuit 1202 including a resistor R1 and capacitor C1. The capacitor C1 may be coupled to the node ISNS1+ and the node ISNS1−, which may be inputs to the control circuit 1204. The resistor R1 may be coupled to the switching node SW1 and the capacitor C1. The control circuit 1204 may receive a first voltage that represents first current information, e.g., a representation of current iL1 through the inductor L1, which is one of the N primary windings of the TLVR 100. The first current information may include the AC component of the inductor current iL1.

The current sensing circuit 1200 may include a second circuit 1206 coupled to the node VLC, which is coupled to the inductor Lc of the TLVR 100. The second circuit 1206 may be a passive network including resistor R3 and capacitor C3, which are coupled in series. The second circuit 1206 may be coupled to node ISNS1+ such that the control circuit 1204 receives a second voltage that represents second current information, e.g., a representation of current iLc through the inductor Lc, which is one of the linked secondary windings of the TLVR 100. The second current information may include the AC component of the inductor current iLc. The control circuit 1204 may receive and combine the first current information and the second current information to sense a current, such as to determine information about the inductor current iL1 and the inductor current iLc, such as peak current, valley current, and intermediate ripples.

It should be noted that the current sensing circuit 1200 in FIG. 12 may be used to sense the current for one phase of the multi-phase TLVR voltage regulator 100. The coupling iLC current information from the secondary side for other phases may be similarly obtained by circuits similar to the first and second circuits 1202, 1206, which may be input into the control circuit 1204 using separate inputs.

In some examples, the inductor Lc in FIG. 12 can be replaced by a transformer, such as the transformer 206 shown in FIG. 2.

Figure 13:
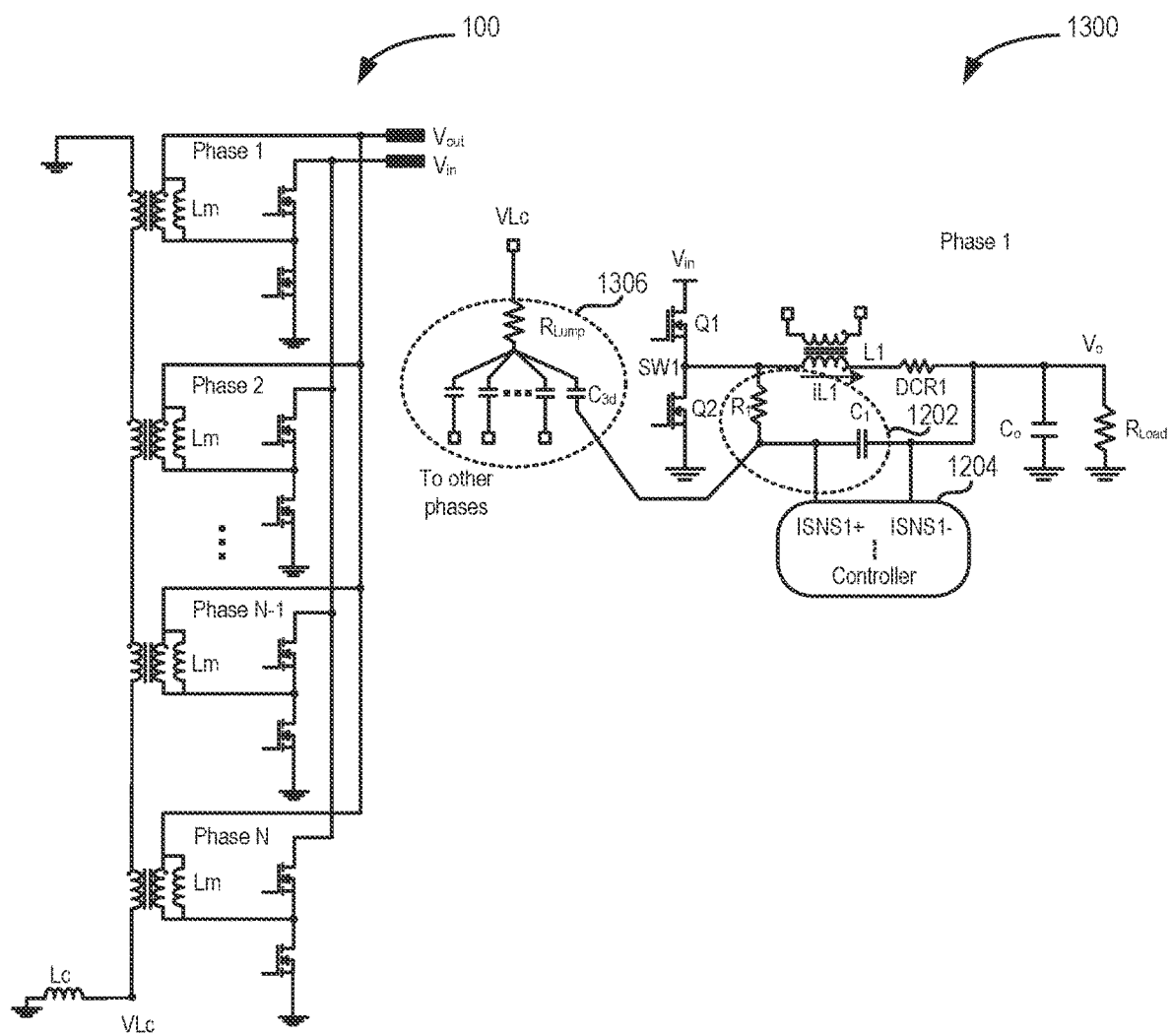
FIG. 13 is another example of a current sensing circuit for use with a multi-phase TLVR voltage regulator, in accordance with various techniques of this disclosure.

FIG. 13 is another example of a current sensing circuit for use with a multi-phase TLVR voltage regulator 100, in accordance with various techniques of this disclosure. Many of the components in FIG. 13 are similar to those in FIG. 12 and, for purposes of conciseness, will not be described in detail.

The current sensing circuit 1300 may include a first circuit 1202 including a resistor R1 and capacitor C1. The capacitor C1 may be coupled to the node ISNS1+ and the node ISNS1−, which may be inputs to the control circuit 1204. The resistor R1 may be coupled to the switching node SW1 and the capacitor C1. The control circuit 1204 may receive a first voltage that represents first current information, e.g., a representation of current iL1 through the inductor L1, which is one of the N primary windings of the TLVR 100. The first current information may include the AC component of the inductor current iL1.

The current sensing circuit 1300 may include a second circuit 1306 coupled to the node VLC, which is coupled to the inductor Lc of the TLVR 100 via a node VLC. In contrast to the second circuit 1206 of FIG. 12, the current sensing circuit 1300 of FIG. 13 includes a second circuit 1306 having a resistor $R_{LUMP}$ coupled in series with a plurality of parallel-connected second capacitors C3. With respect to FIG. 12, each phase of the multi-phase TLVR voltage regulator 100 uses a corresponding second circuit 1206. With the configuration in FIG. 13, however, one resistor $R_{LUMP}$ may be shared for each RC branch of the secondary side with other phases using a corresponding capacitor C3.

The second circuit 1306 may be coupled to node ISNS1+ such that the control circuit 1204 receives a second voltage that represents second current information, e.g., a representation of current iLc through the inductor Lc, which is one of the linked secondary windings of the TLVR 100. The second current information may include the AC component of the inductor current iLc. The control circuit 1204 may receive and combine the first current information and the second current information to sense a current, such as to determine information about the inductor current iL1 and the inductor current iLc, such as peak current, valley current, and intermediate ripples.

In some examples, the inductor Lc in FIG. 13 can be replaced by a transformer, such as the transformer 206 shown in FIG. 2.

Figure 14:
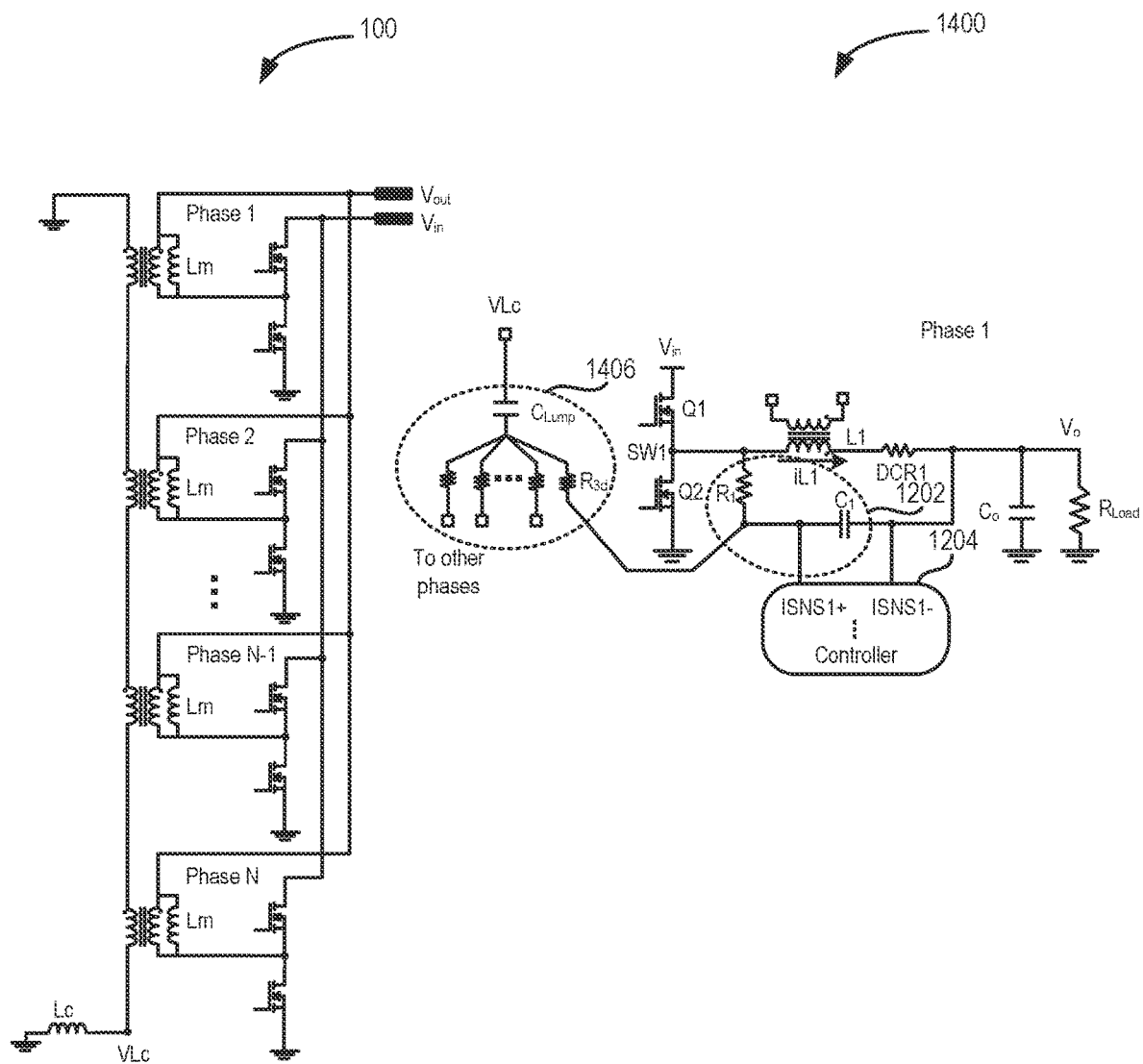
FIG. 14 is another example of a current sensing circuit for use with a multi-phase TLVR voltage regulator, in accordance with various techniques of this disclosure.

FIG. 14 is another example of a current sensing circuit for use with a multi-phase TLVR voltage regulator 100, in accordance with various techniques of this disclosure. Many of the components in FIG. 14 are similar to those in FIG. 12 and, for purposes of conciseness, will not be described in detail.

The current sensing circuit 1400 may include a first circuit 1202 including a resistor R1 and capacitor C1. The capacitor C1 may be coupled to the node ISNS1+ and the node ISNS1−, which may be inputs to the control circuit 1204. The resistor R1 may be coupled to the switching node SW1 and the capacitor C1. The control circuit 1204 may receive a first voltage that represents first current information, e.g., a representation of current iL1 through the inductor L1, which is one of the N primary windings of the TLVR 100. The first current information may include the AC component of the inductor current iL1.

The current sensing circuit 1400 may include a second circuit 1406 coupled to the node VLC, which is coupled to the inductor Lc of the TLVR 100. In contrast to the second circuit 1206 of FIG. 12, the current sensing circuit 1400 of FIG. 13 includes a second circuit 1406 having a capacitor $C_{LUMP}$ coupled in series with a plurality of parallel-connected second resistors R3. With respect to FIG. 12, each phase of the multi-phase TLVR voltage regulator 100 uses a corresponding second circuit 1206. With the configuration in FIG. 14, however, one capacitor $C_{LUMP}$ may be shared for each RC branch of the secondary side with other phases using a corresponding resistor C3.

The second circuit 1406 may be coupled to node ISNS1+ such that the control circuit 1204 receives a second voltage that represents second current information, e.g., a representation of current iLc through the inductor Lc, which is one of the linked secondary windings of the TLVR 100. The second current information may include the AC component of the inductor current iLc. The control circuit 1204 may receive and combine the first current information and the second current information to sense a current, such as to determine information about the inductor current iL1 and the inductor current iLc, such as peak current, valley current, and intermediate ripples.

In some examples, the inductor Lc in FIG. 14 can be replaced by a transformer, such as the transformer 206 shown in FIG. 2.

Figure 15:
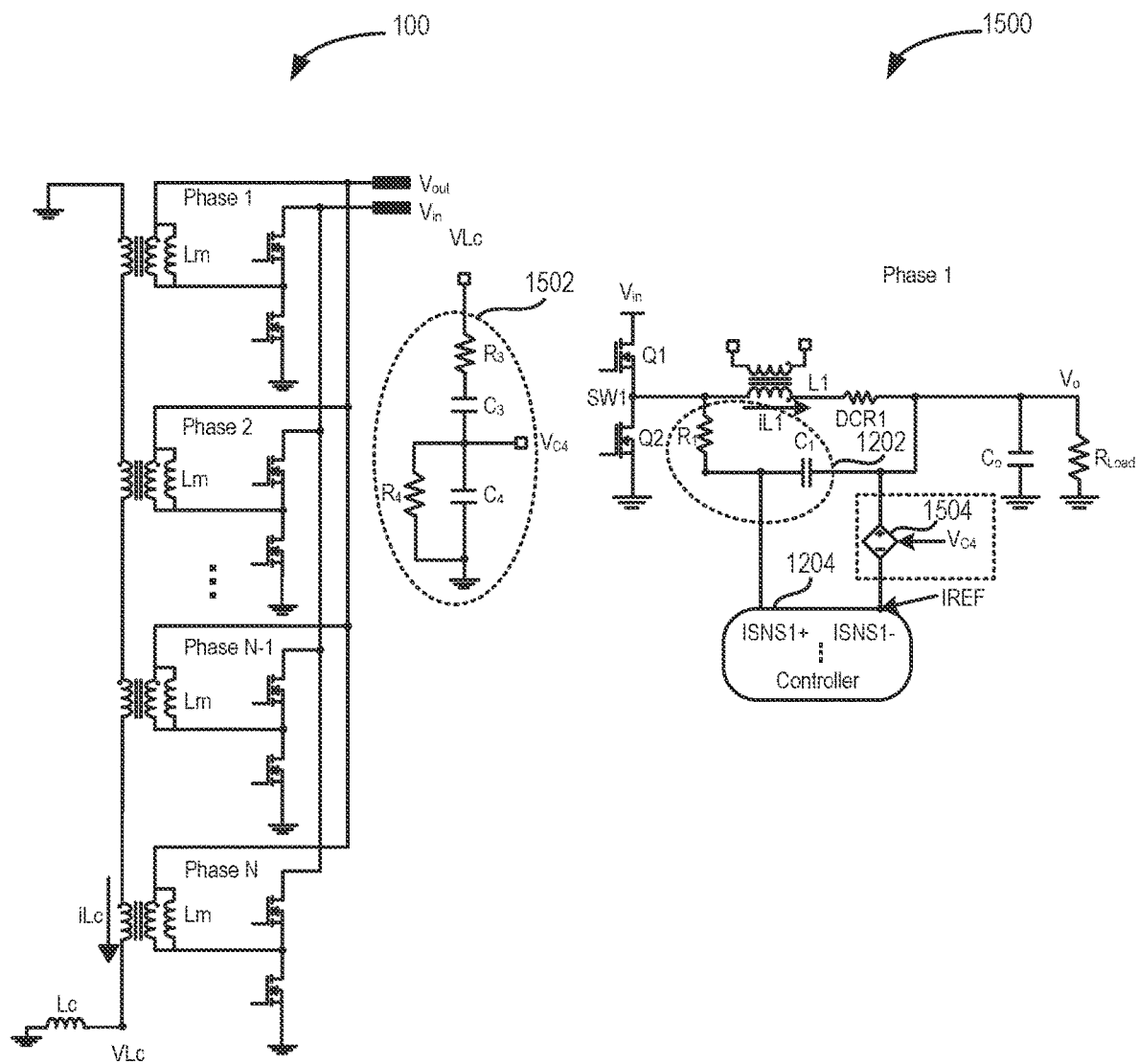
FIG. 15 is another example of a current sensing circuit for use with a multi-phase TLVR voltage regulator, in accordance with various techniques of this disclosure.

FIG. 15 is another example of a current sensing circuit for use with a multi-phase TLVR voltage regulator 100, in accordance with various techniques of this disclosure. Many of the components in FIG. 15 are similar to those in FIG. 12 and, for purposes of conciseness, will not be described in detail.

The current sensing circuit 1500 may include a first circuit 1202 including a resistor R1 and capacitor C1. The capacitor C1 may be coupled to the node ISNS1+ and the node ISNS1−, which may be inputs to the control circuit 1204. The resistor R1 may be coupled to the switching node SW1 and the capacitor C1. The control circuit 1204 may receive a first voltage that represents first current information, e.g., a representation of current iL1 through the inductor L1, which is one of the N primary windings of the TLVR 100. The first current information may include the AC component of the inductor current iL1.

The current sensing circuit 1500 of FIG. 15 includes a second circuit having an RC network 1502 coupled to a voltage-controlled voltage source (VCVS) 1504. The RC network 1502 may be coupled to receive the voltage at node VLC, which is coupled to the inductor Lc of the TLVR 100. The RC network 1502 outputs a voltage VC4 that is applied to the VCVS 1504.

The voltage from the VCVS 1504 is a reference voltage that may be shared by each phase of the multi-phase TLVR voltage regulator 100. Only one RC network is used from the secondary side of the multi-phase TLVR voltage regulator 100 to obtain the voltage VC4.

As seen in FIG. 15, the VCVS 1504 may be coupled to node ISNS1−, which may be an input to the control circuit 1204, such that the control circuit 1204 receives a second voltage that represents second current information, e.g., a representation of current iLc through the inductor Lc, which is one of the linked secondary windings of the TLVR 100. The second current information may include the AC component of the inductor current iLc. The control circuit 1204 may receive and combine the first current information and the second current information to sense a current, such as to determine information about the inductor current iL1 and the inductor current iLc, such as peak current, valley current, and intermediate ripples.

In some examples, the inductor Lc in FIG. 15 can be replaced by a transformer, such as the transformer 206 shown in FIG. 2.

Figure 16:
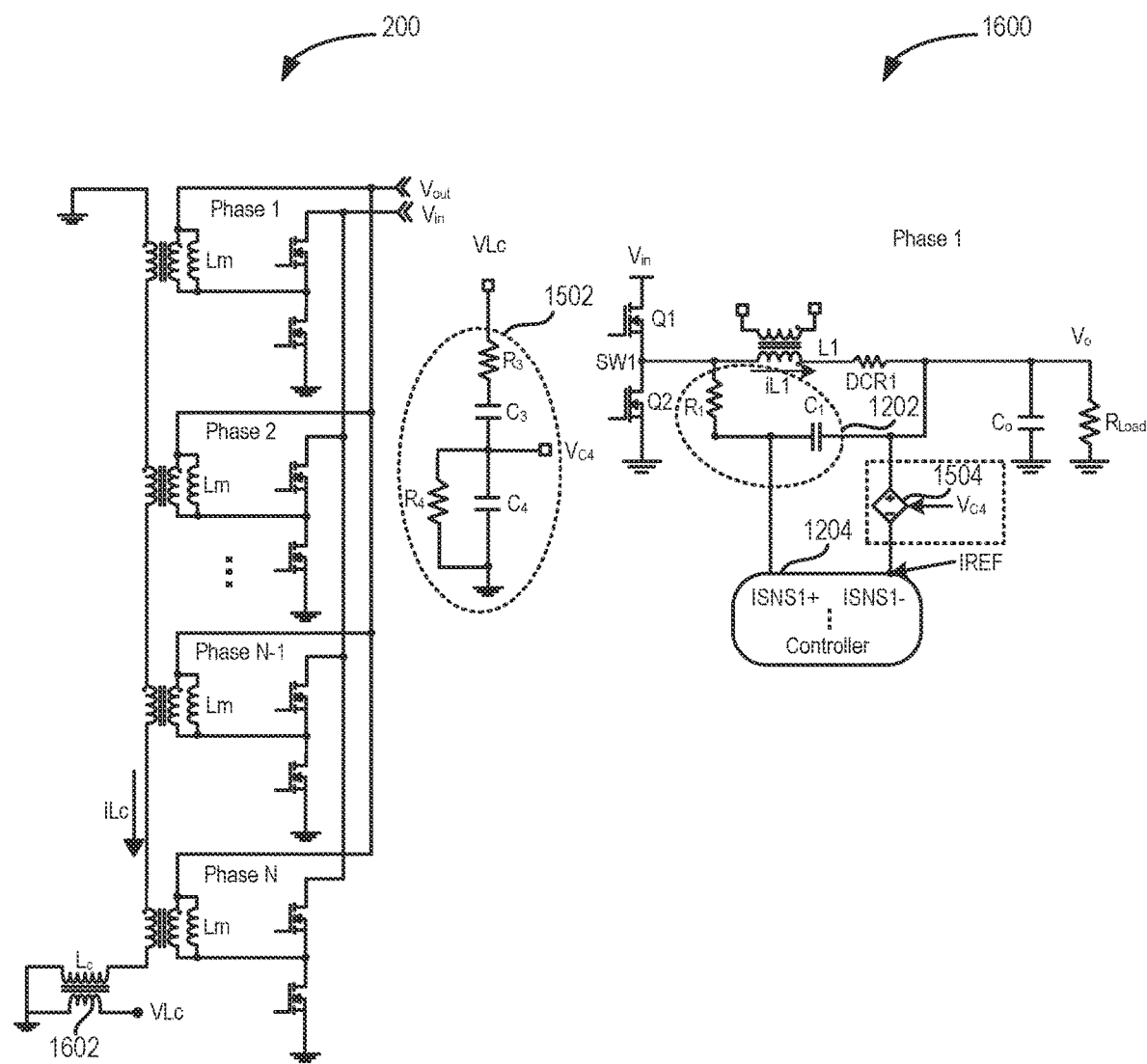
FIG. 16 is another example of a current sensing circuit for use with a multi-phase TLVR voltage regulator, in accordance with various techniques of this disclosure.

FIG. 16 is another example of a current sensing circuit for use with a multi-phase TLVR voltage regulator 200, in accordance with various techniques of this disclosure. Many of the components in FIG. 16 are similar to those in FIG. 12 and, for purposes of conciseness, will not be described in detail.

The current sensing circuit 1600 may include a first circuit 1202 including a resistor R1 and capacitor C1. The capacitor C1 may be coupled to the node ISNS1+ and the node ISNS1−, which may be inputs to the control circuit 1204. The resistor R1 may be coupled to the switching node SW1 and the capacitor C1. The control circuit 1204 may receive a first voltage that represents first current information, e.g., a representation of current iL1 through the inductor L1, which is one of the N primary windings of the TLVR 200. The first current information may include the AC component of the inductor current iL1.

In FIG. 16, the linked secondary windings of the TLVR 200 includes a primary winding of a transformer 1602, where the transformer 1602 replaces the discrete inductor Lc of the TLVR 100 of FIG. 1.

The current sensing circuit 1600 of FIG. 16 includes a second circuit having an RC network 1502 coupled to a voltage-controlled voltage source (VCVS) 1504. The RC network 1502 may be coupled to receive the voltage at node VLC, which is coupled to the secondary winding of the transformer 1602 of the TLVR 200. The RC network 1502 outputs a voltage VC4 that is applied to the VCVS 1504.

The voltage from the VCVS 1504 is a reference voltage that may be shared by each phase of the multi-phase TLVR voltage regulator 200. Only one RC network is used from the secondary side of the multi-phase TLVR voltage regulator 200 to obtain the voltage VC4.

As seen in FIG. 16, the VCVS 1504 may be coupled to node ISNS1−, which may be an input to the control circuit 1204, such that the control circuit 1204 receives a second voltage that represents second current information, e.g., a representation of current iLc through the inductor Lc, which is one of the linked secondary windings of the TLVR 200. The second current information may include the AC component of the inductor current iLc. The control circuit 1204 may receive and combine the first current information and the second current information to sense a current, such as to determine information about the inductor current iL1 and the inductor current iLc, such as peak current, valley current, and intermediate ripples.

Figure 17:
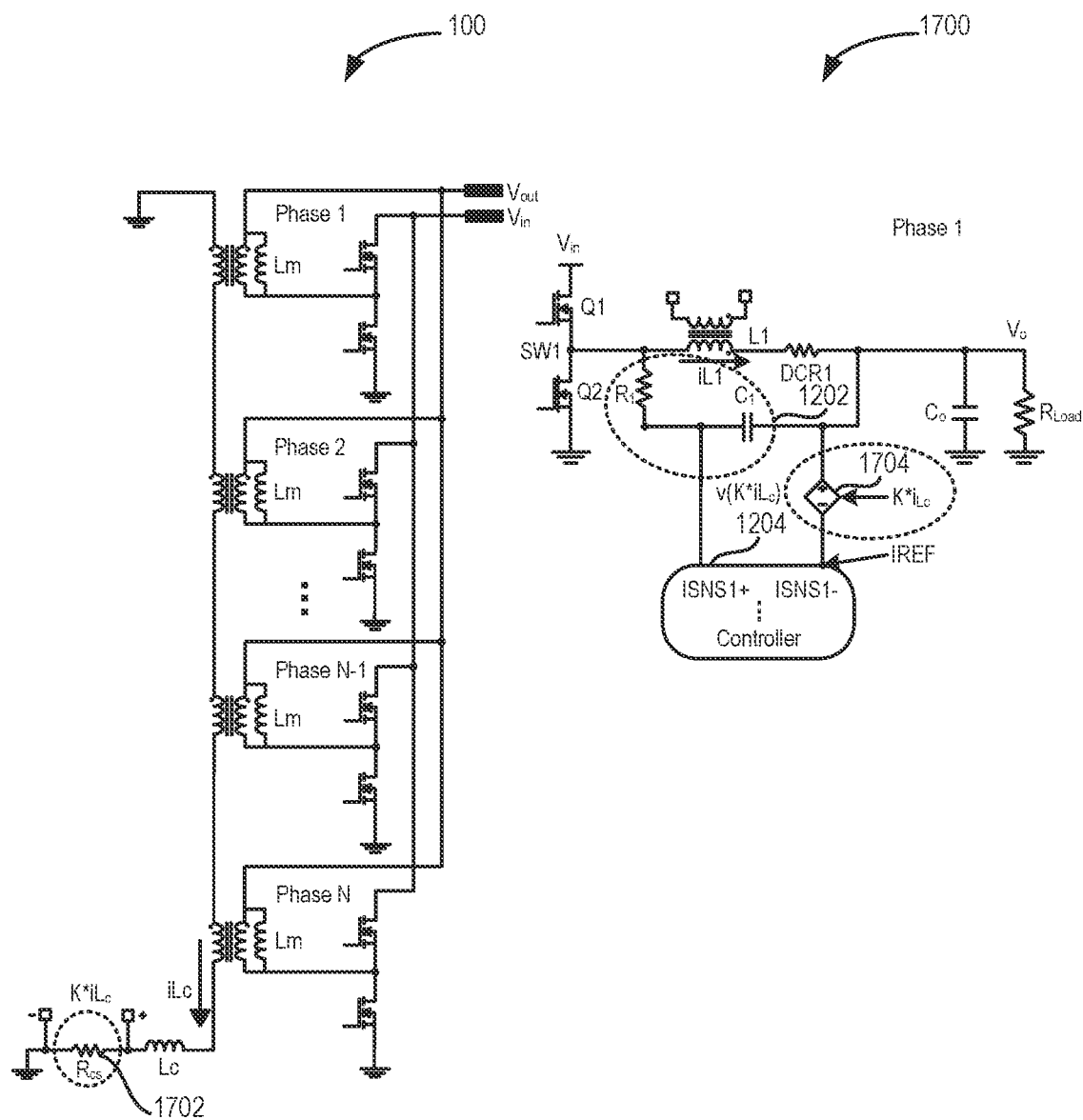
FIG. 17 is another example of a current sensing circuit for use with a multi-phase TLVR voltage regulator, in accordance with various techniques of this disclosure.

FIG. 17 is another example of a current sensing circuit for use with a multi-phase TLVR voltage regulator 100, in accordance with various techniques of this disclosure. Many of the components in FIG. 17 are similar to those in FIG. 12 and, for purposes of conciseness, will not be described in detail.

The current sensing circuit 1700 may include a first circuit 1202 including a resistor R1 and capacitor C1. The capacitor C1 may be coupled to the node ISNS1+ and the node ISNS1−, which may be inputs to the control circuit 1204. The resistor R1 may be coupled to the switching node SW1 and the capacitor C1. The control circuit 1204 may receive a first voltage that represents first current information, e.g., a representation of current iL1 through the inductor L1, which is one of the N primary windings of the TLVR 100. The first current information may include the AC component of the inductor current iL1.

In FIG. 17, a sense resistor 1702 is coupled in series with the inductor Lc. The current iLc through the linked secondary windings of the TLVR generates a voltage K*iLc through the sense resistor 1702, where K is a gain of the current iLC and corresponds to the resistance of the sense resistor 1702.

The voltage K*iLc generated across the sense resistor 1702 may be applied to a second circuit 1704, such as including a voltage-controlled voltage source. The voltage from the second circuit 1704 is a reference voltage that may be shared by each phase of the multi-phase TLVR voltage regulator 100. The reference voltage is the sum of the bias voltage Vbias_dc+v(K*iLc).

As seen in FIG. 17, the voltage-controlled voltage source may be coupled to node ISNS1−, which may be an input to the control circuit 1204, such that the control circuit 1204 receives a second voltage that represents second current information, e.g., a representation of current iLc through the inductor Lc, which is one of the linked secondary windings of the TLVR 100. The second current information may include the AC component of the inductor current iLc. The control circuit 1204 may receive and combine the first current information and the second current information to sense a current, such as to determine information about the inductor current iL1 and the inductor current iLc, such as peak current, valley current, and intermediate ripples.

Figure 18:
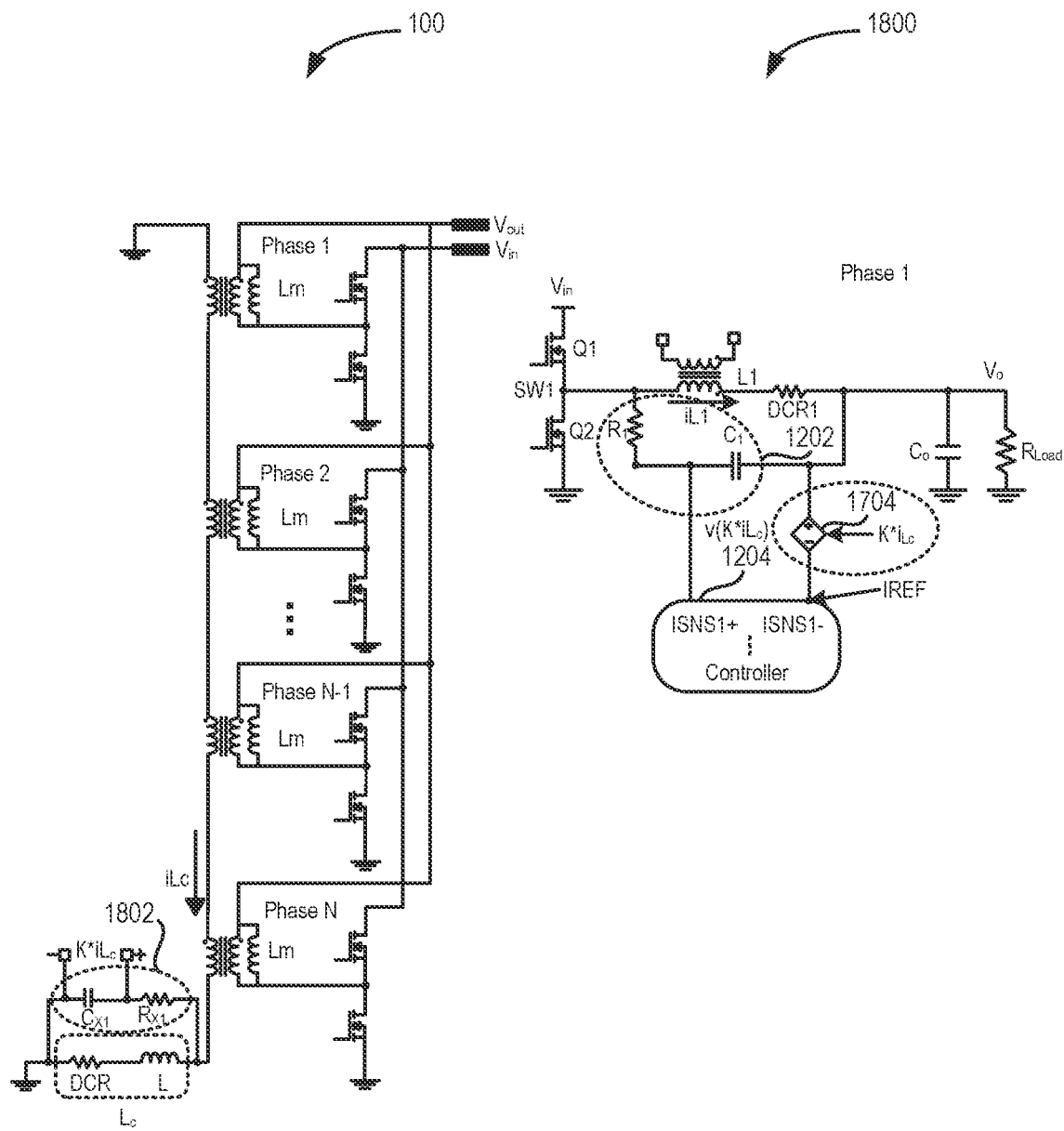
FIG. 18 is another example of a current sensing circuit for use with a multi-phase TLVR voltage regulator, in accordance with various techniques of this disclosure.

FIG. 18 is another example of a current sensing circuit for use with a multi-phase TLVR voltage regulator 100, in accordance with various techniques of this disclosure. Many of the components in FIG. 18 are similar to those in FIG. 12 and, for purposes of conciseness, will not be described in detail.

The current sensing circuit 1800 may include a first circuit 1202 including a resistor R1 and capacitor C1. The capacitor C1 may be coupled to the node ISNS1+ and the node ISNS1−, which may be inputs to the control circuit 1204. The resistor R1 may be coupled to the switching node SW1 and the capacitor C1. The control circuit 1204 may receive a first voltage that represents first current information, e.g., a representation of current iL1 through the inductor L1, which is one of the N primary windings of the TLVR 100. The first current information may include the AC component of the inductor current iL1.

In FIG. 18, the inductor Lc is shown as including an inductance L in series with the inductor's DC resistance (DCR). Using the techniques of FIG. 18, an RC network 1802 including a resistor RX1 and a capacitor CX1 are coupled in parallel with the linked secondary windings of the TLVR 100. The current iLc through the linked secondary windings of the TLVR generates a voltage K*iLc across the capacitor CX1 of the RC network 1802, where K is a gain of the current iLC and is related to RX1, CX1, Lc, and DCR of Lc.

The voltage K*iLc generated across the capacitor CX1 of the RC network 1802 may be applied to a second circuit 1704, such as including a voltage-controlled voltage source. The voltage from the second circuit 1704 is a reference voltage that may be shared by each phase of the multi-phase TLVR voltage regulator 100. The reference voltage is the sum of the bias voltage Vbias_dc+v(K*iLc).

As seen in FIG. 18, the voltage-controlled voltage source may be coupled to node ISNS1−, which may be an input to the control circuit 1204, such that the control circuit 1204 receives a second voltage that represents second current information, e.g., a representation of current iLc through the inductor Lc, which is one of the linked secondary windings of the TLVR 100. The second current information may include the AC component of the inductor current iLc. The control circuit 1204 may receive and combine the first current information and the second current information to sense a current, such as to determine information about the inductor current iL1 and the inductor current iLc, such as peak current, valley current, and intermediate ripples.

Figure 19:
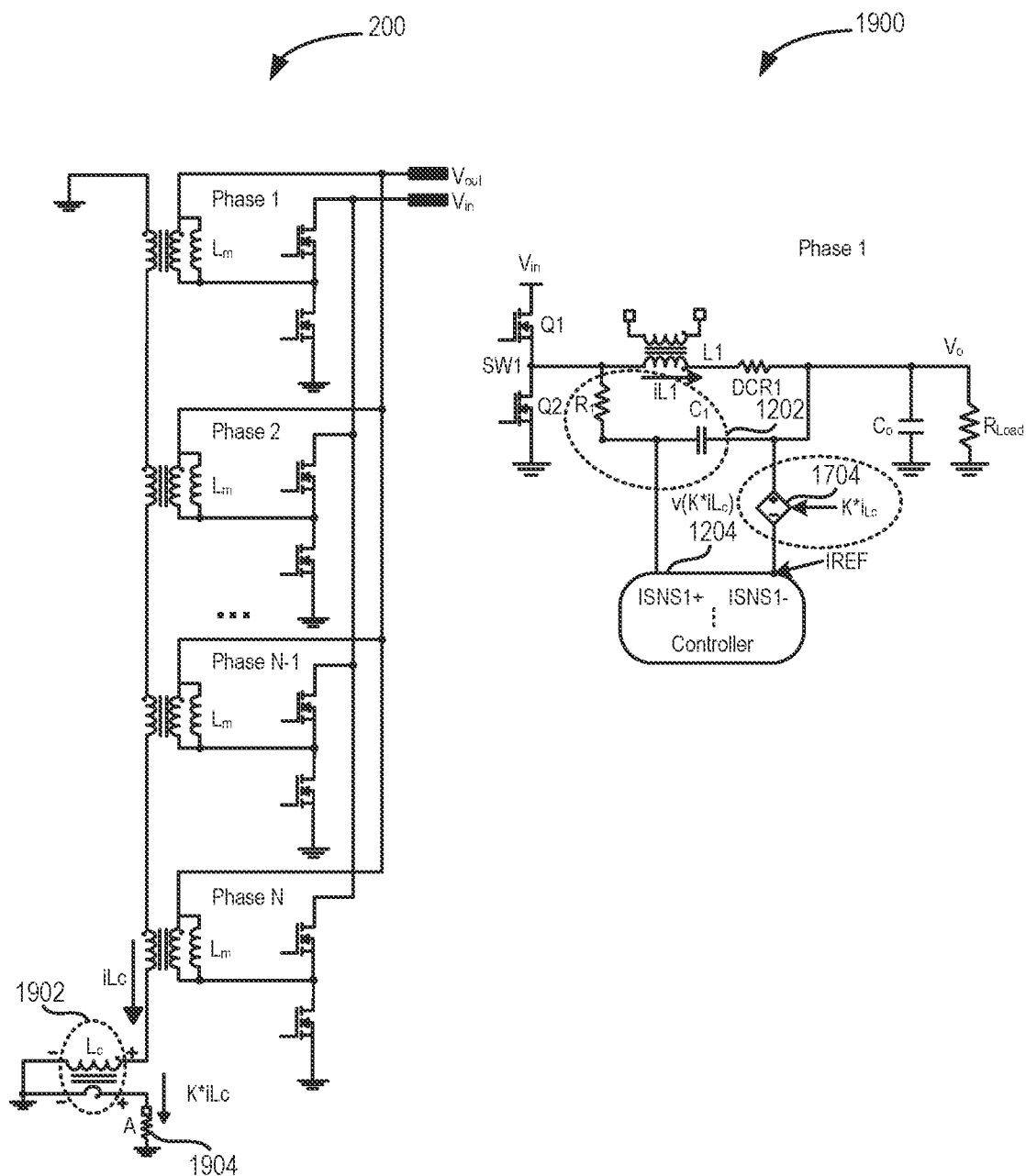
FIG. 19 is another example of a current sensing circuit for use with a multi-phase TLVR voltage regulator, in accordance with various techniques of this disclosure.

FIG. 19 is another example of a current sensing circuit for use with a multi-phase TLVR voltage regulator 200, in accordance with various techniques of this disclosure. Many of the components in FIG. 19 are similar to those in FIG. 12 and, for purposes of conciseness, will not be described in detail.

The current sensing circuit 1900 may include a first circuit 1202 including a resistor R1 and capacitor C1. The capacitor C1 may be coupled to the node ISNS1+ and the node ISNS1−, which may be inputs to the control circuit 1204. The resistor R1 may be coupled to the switching node SW1 and the capacitor C1. The control circuit 1204 may receive a first voltage that represents first current information, e.g., a representation of current iL1 through the inductor L1, which is one of the N primary windings of the TLVR 200. The first current information may include the AC component of the inductor current iL1.

In FIG. 19, the inductor Lc includes a primary winding of a transformer 1902, where the transformer 1902 replaces the discrete inductor Lc of the TLVR 100 of FIG. 1. Using the techniques of FIG. 19, a resistor 1904 may be coupled to a secondary winding of the transformer 1902. The current iLc through the linked secondary windings of the TLVR generates a voltage K*iLc across the resistor 1904, where K is a gain of the current iLC and corresponds to the resistance of the resistor 1904.

The voltage K*iLc generated across the resistor 1922 may be applied to a second circuit 1704, such as including a voltage-controlled voltage source. The voltage from the second circuit 1704 is a reference voltage that may be shared by each phase of the multi-phase TLVR voltage regulator 200. The reference voltage is the sum of the bias voltage Vbias_dc+v(K*iLc).

As seen in FIG. 19, the voltage-controlled voltage source may be coupled to node ISNS1−, which may be an input to the control circuit 1204, such that the control circuit 1204 receives a second voltage that represents second current information, e.g., a representation of current iLc through the inductor Lc, which is one of the linked secondary windings of the TLVR 200. The second current information may include the AC component of the inductor current iLc. The control circuit 1204 may receive and combine the first current information and the second current information to sense a current, such as to determine information about the inductor current iL1 and the inductor current iLc, such as peak current, valley current, and intermediate ripples.

Figure 20:
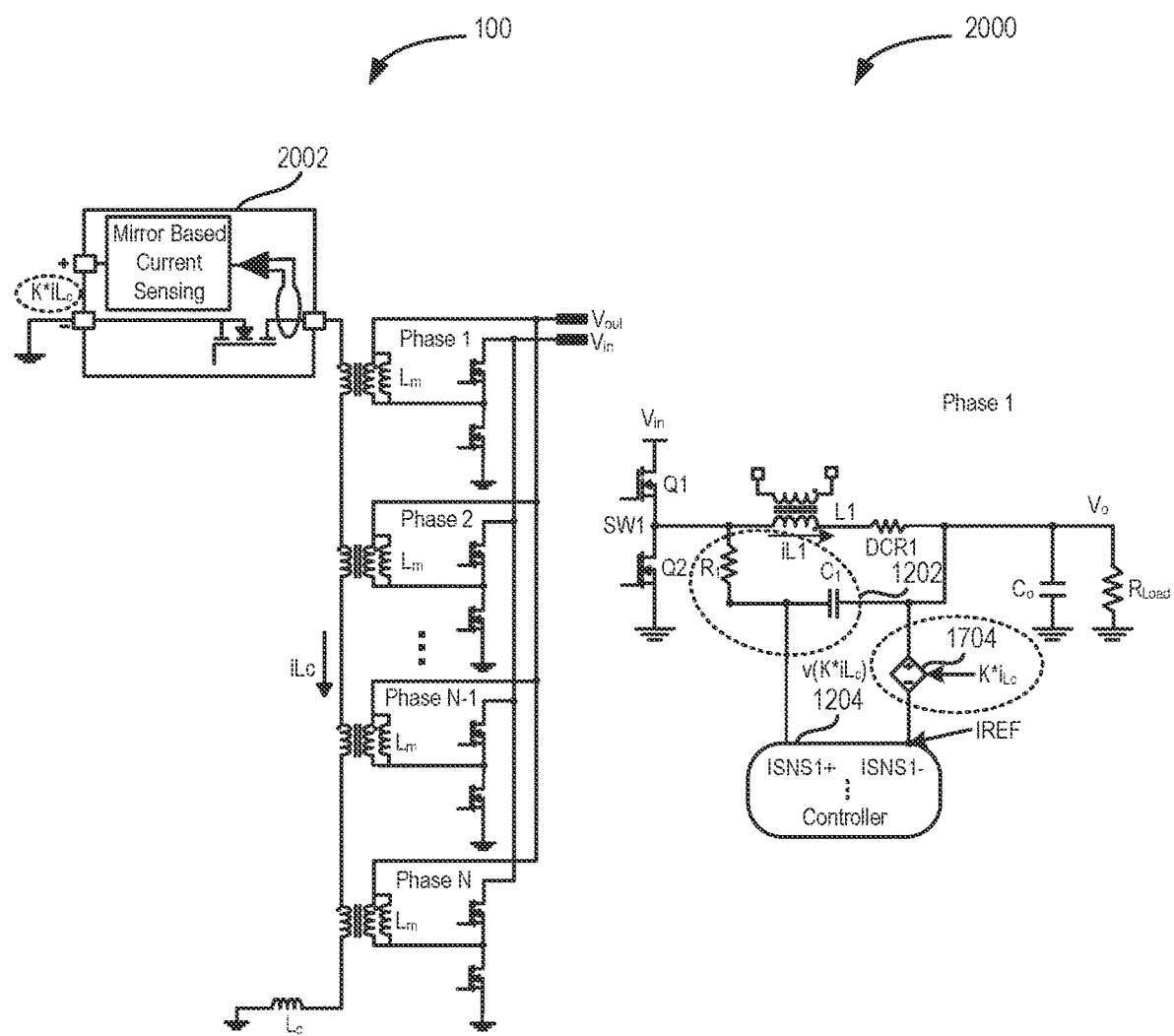
FIG. 20 is another example of a current sensing circuit for use with a multi-phase TLVR voltage regulator, in accordance with various techniques of this disclosure.

FIG. 20 is another example of a current sensing circuit for use with a multi-phase TLVR voltage regulator 100, in accordance with various techniques of this disclosure. Many of the components in FIG. 20 are similar to those in FIG. 12 and, for purposes of conciseness, will not be described in detail.

The current sensing circuit 2000 may include a first circuit 1202 including a resistor R1 and capacitor C1. The capacitor C1 may be coupled to the node ISNS1+ and the node ISNS1−, which may be inputs to the control circuit 1204. The resistor R1 may be coupled to the switching node SW1 and the capacitor C1. The control circuit 1204 may receive a first voltage that represents first current information, e.g., a representation of current iL1 through the inductor L1, which is one of the N primary windings of the TLVR 100. The first current information may include the AC component of the inductor current iL1.

In FIG. 20, current mirror circuitry 2002 may be coupled to the linked secondary windings of the TLVR 100 to generate a representation of the second current information through the linked secondary windings. Using the techniques of FIG. 20, the current iLc through the linked secondary windings of the TLVR generates a voltage K*iLc at the output of the current mirror circuitry 2002, where K is a gain of the iLC and corresponds to a scaling of the current mirror circuitry 1002.

The voltage K*iLc generated at the output of the current mirror circuitry 2002 may be applied to a second circuit 1202, such as including a voltage-controlled voltage source. The voltage from the second circuit 1202 is a reference voltage IREF that may be shared by each phase of the multi-phase TLVR voltage regulator 100. The reference voltage IREF is the sum of the bias voltage Vbias_dc+v(K*iLc).

As seen in FIG. 20, the voltage-controlled voltage source may be coupled to node ISNS1−, which may be an input to the control circuit 1204, such that the control circuit 1204 receives a second voltage that represents second current information, e.g., a representation of current iLc through the inductor Lc, which is one of the linked secondary windings of the TLVR 200. The second current information may include the AC component of the inductor current iLc. The control circuit 1204 may receive and combine the first current information and the second current information to sense a current, such as to determine information about the inductor current iL1 and the inductor current iLc, such as peak current, valley current, and intermediate ripples.

The TLVR 100 of FIG. 1 and the TLVR 200 of FIG. 2 included an additional inductor Lc at the secondary side. In FIG. 1, the Lc was a discrete inductor and, in FIG. 2, the Lc was replaced by a transformer. Various techniques of this disclosure may be applied to a TLVR that does not have an additional inductor Lc at the secondary side. Examples are described below with respect to FIGS. 21-24.

Figure 21:
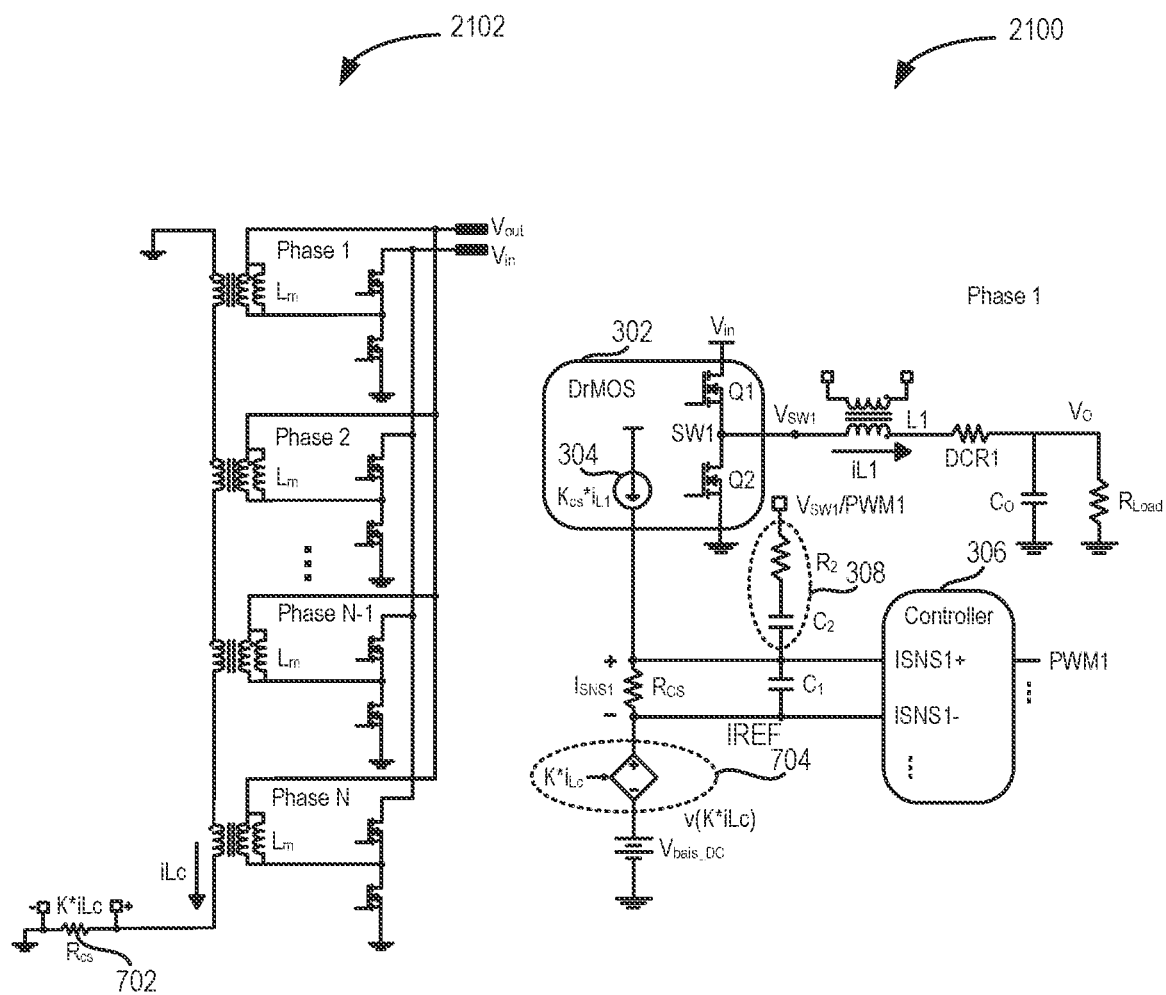
FIG. 21 is an example of a current sensing circuit for use with a multi-phase TLVR voltage regulator that does not have an additional inductor Lc at the secondary side, in accordance with various techniques of this disclosure.

FIG. 21 is an example of a current sensing circuit 2100 for use with a multi-phase TLVR voltage regulator 2102 that does not have an additional inductor Lc at the secondary side, in accordance with various techniques of this disclosure. Many of the components in FIG. 21 are similar to those in FIG. 7 and, for purposes of conciseness, will not be described in detail.

The current sensing circuit 2100 may include a first circuit 308 coupled to either the switching node SW1 or to the output node PWM1 of the control circuit 306. The first circuit 308 may be a passive network including resistor R2 and capacitor C2, which are coupled in series. The first circuit 308 may be coupled to node ISNS1+, which may be an input to the control circuit 306, such that the control circuit 306 receives a first voltage that represents first current information, e.g., a representation of current iL1 through the inductor L1, which is one of the N primary windings of the TLVR 2102. The first current information may include the AC component of the inductor current iL1.

In FIG. 21, a sense resistor 702 is coupled in series with the inductor Lc. The current iLc through the linked secondary windings of the TLVR generates a voltage K*iLc across the sense resistor 702, where K is a gain of the iLC and corresponds to the resistance of the sense resistor 702.

The voltage K*iLc generated across the sense resistor 702 may be applied to a second circuit 704, such as including a voltage-controlled voltage source. The voltage from the second circuit 704 is a reference voltage that may be shared by each phase of the multi-phase TLVR voltage regulator 2102. The reference voltage is the sum of the bias voltage Vbias_dc+v(K*iLc).

As seen in FIG. 21, the second circuit 704 may be coupled to node ISNS1−, which may be an input to the control circuit 306, such that the control circuit 306 receives a second voltage that represents second current information, e.g., a representation of current iLc through the secondary windings of the TLVR 2102. The second current information may include the AC component of the inductor current iLc. The control circuit 306 may receive and combine the first current information and the second current information to sense a current, such as to determine information about the inductor current iL1 and the current iLc, such as peak current, valley current, and intermediate ripples.

Figure 22:
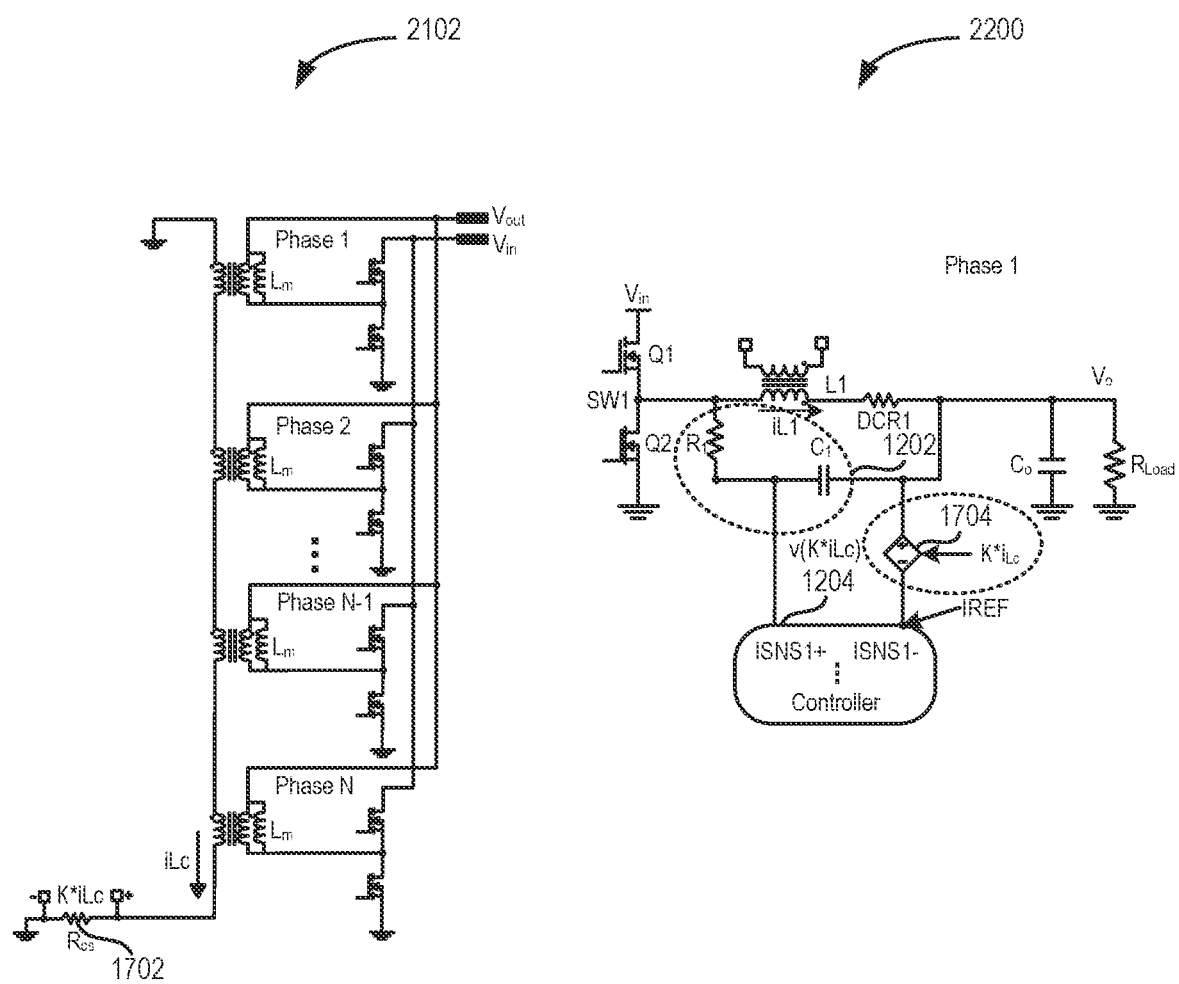
FIG. 22 is an example of a current sensing circuit for use with a multi-phase TLVR voltage regulator that does not have an additional inductor Lc at the secondary side, in accordance with various techniques of this disclosure.

FIG. 22 is another example of a current sensing circuit 2200 for use with a multi-phase TLVR voltage regulator 2102 that does not have an additional inductor Lc at the secondary side, in accordance with various techniques of this disclosure. Many of the components in FIG. 22 are similar to those in FIG. 17 and, for purposes of conciseness, will not be described in detail.

The current sensing circuit 2200 may include a first circuit 1202 including a resistor R1 and capacitor C1. The capacitor C1 may be coupled to the node ISNS1+ and the node ISNS1−, which may be inputs to the control circuit 1204. The resistor R1 may be coupled to the switching node SW1 and the capacitor CL. The control circuit 1204 may receive a first voltage that represents first current information, e.g., a representation of current $i_{L1}$ through the inductor L1, which is one of the N primary windings of the TLVR 2102. The first current information may include the AC component of the inductor current iL1.

In FIG. 22, a sense resistor 1702 is coupled in series with the inductor Lc. The current iLc through the linked secondary windings of the TLVR generates a voltage K*iLc through the sense resistor 1702, where K is a gain of the current iLC and corresponds to the resistance of the sense resistor 1702.

The voltage K*iLc generated across the sense resistor 1702 may be applied to a second circuit 1704, such as including a voltage-controlled voltage source. The voltage from the second circuit 1704 is a reference voltage that may be shared by each phase of the multi-phase TLVR voltage regulator 100. The reference voltage is the sum of the bias voltage Vbias_dc+v(K*iLc).

As seen in FIG. 22, the voltage-controlled voltage source may be coupled to node ISNS1−, which may be an input to the control circuit 1204, such that the control circuit 1204 receives a second voltage that represents second current information, e.g., a representation of current iLc through the secondary windings of the TLVR 2102. The second current information may include the AC component of the current iLc. The control circuit 1204 may receive and combine the first current information and the second current information to sense a current, such as to determine information about the inductor current iL1 and the current iLc, such as peak current, valley current, and intermediate ripples.

Figure 23:
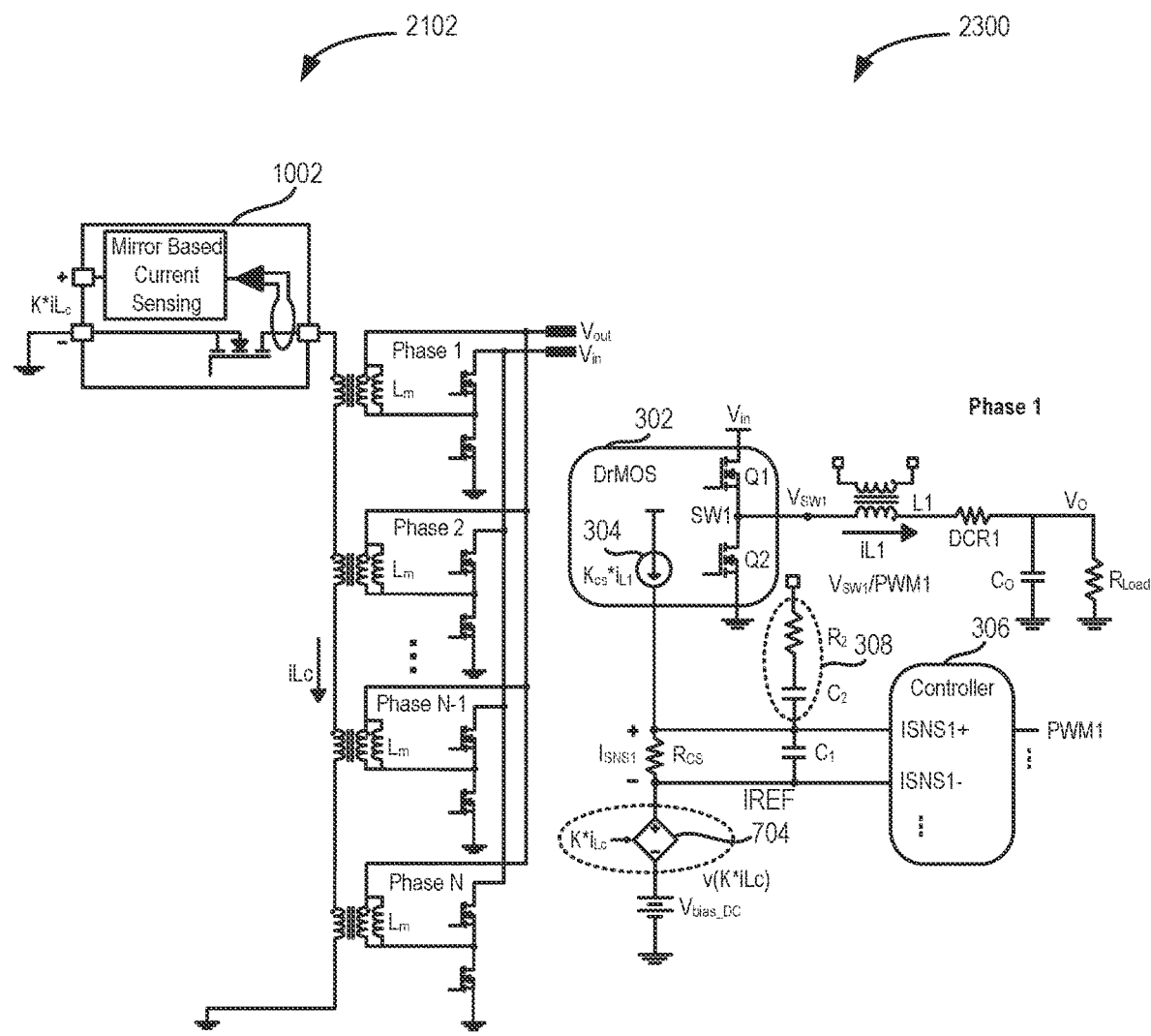
FIG. 23 is an example of a current sensing circuit for use with a multi-phase TLVR voltage regulator that does not have an additional inductor Lc at the secondary side, in accordance with various techniques of this disclosure.

FIG. 23 is another example of a current sensing circuit 2300 for use with a multi-phase TLVR voltage regulator 2102 that does not have an additional inductor Lc at the secondary side, in accordance with various techniques of this disclosure. Many of the components in FIG. 23 are similar to those in FIG. 10 and, for purposes of conciseness, will not be described in detail.

The current sensing circuit 2300 may include a first circuit 308 coupled to either the switching node SW1 or to the output node PWM1 of the control circuit 306. The first circuit 308 may be a passive network including resistor R2 and capacitor C2, which are coupled in series. The first circuit 308 may be coupled to node ISNS1+, which may be an input to the control circuit 306, such that the control circuit 306 receives a first voltage that represents first current information, e.g., a representation of current iL1 through the inductor L1, which is one of the N primary windings of the TLVR 2102. The first current information may include the AC component of the inductor current iL1.

In FIG. 23, current mirror circuitry 1002 may be coupled to the linked secondary windings of the TLVR 2102 to generate a representation of the second current information through the linked secondary windings. Using the techniques of FIG. 10, the current iLc through the linked secondary windings of the TLVR generates a voltage K*iLc at the output of the current mirror circuitry 1002, where K is a gain of the iLC and corresponds to a scaling of the current mirror circuitry 1002.

The voltage K*iLc generated at the output of the current mirror circuitry 1002 may be applied to a second circuit 704, such as including a voltage-controlled voltage source. The voltage from the second circuit 704 is a reference voltage that may be shared by each phase of the multi-phase TLVR voltage regulator 100. The reference voltage is the sum of the bias voltage Vbias_dc+v(K*iLc).

As seen in FIG. 23, the second circuit 704 may be coupled to node ISNS1−, which may be an input to the control circuit 306, such that the control circuit 306 receives a second voltage that represents second current information, e.g., a representation of current iLc through the linked secondary windings of the TLVR 2102. The second current information may include the AC component of the inductor current iLc. The control circuit 306 may receive and combine the first current information and the second current information to sense a current, such as to determine information about the inductor current iL1 and the current iLc, such as peak current, valley current, and intermediate ripples.

Figure 24:
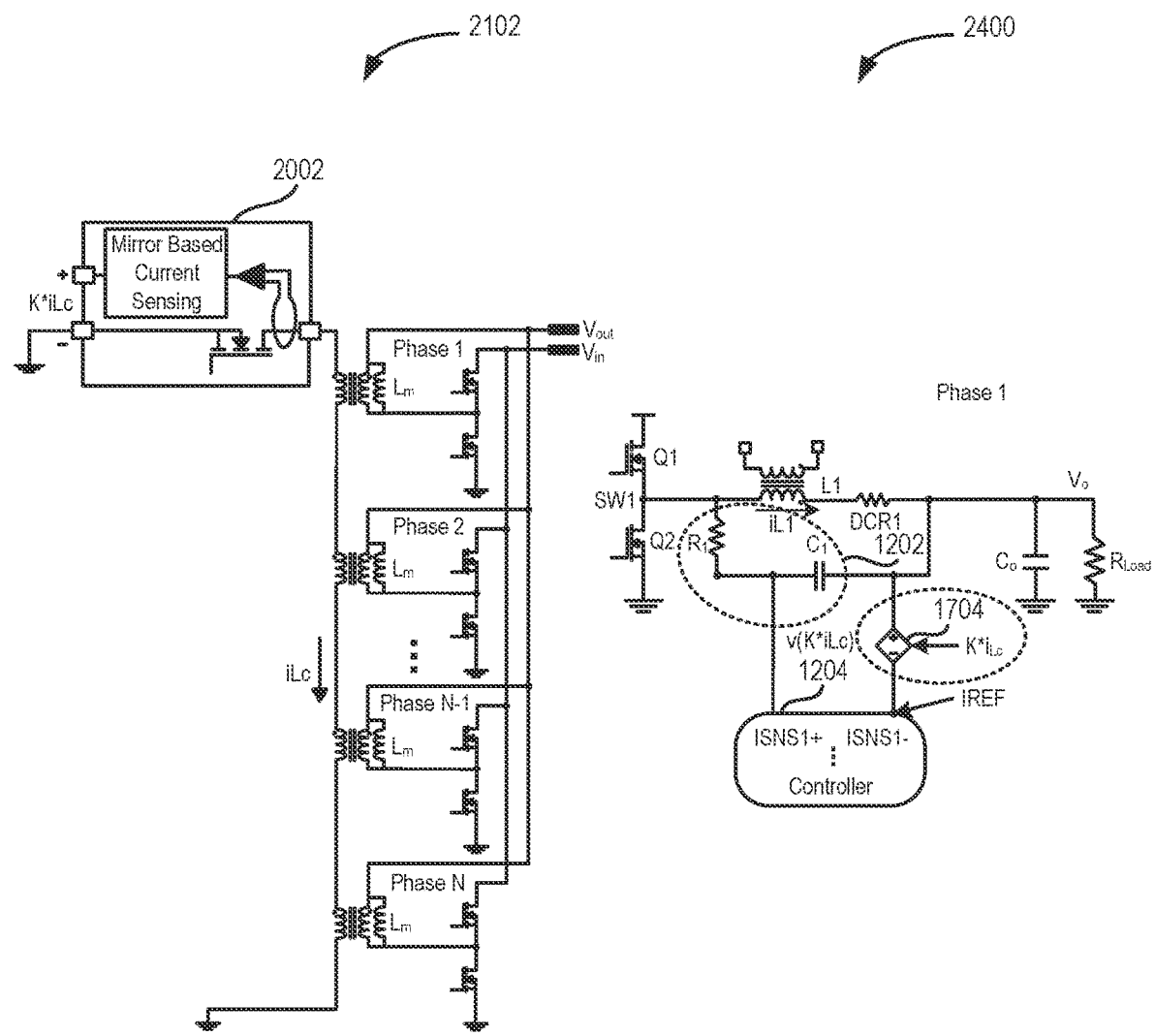
FIG. 24 is an example of a current sensing circuit for use with a multi-phase TLVR voltage regulator that does not have an additional inductor Lc at the secondary side, in accordance with various techniques of this disclosure.

FIG. 24 is another example of a current sensing circuit 2400 for use with a multi-phase TLVR voltage regulator 2102 that does not have an additional inductor Lc at the secondary side, in accordance with various techniques of this disclosure. Many of the components in FIG. 24 are similar to those in FIG. 20 and, for purposes of conciseness, will not be described in detail.

The current sensing circuit 2400 may include a first circuit 1202 including a resistor R1 and capacitor C1. The capacitor C1 may be coupled to the node ISNS1+ and the node ISNS1−, which may be inputs to the control circuit 1204. The resistor R1 may be coupled to the switching node SW1 and the capacitor C1. The control circuit 1204 may receive a first voltage that represents first current information, e.g., a representation of current iL1 through the inductor L1, which is one of the N primary windings of the TLVR 2102. The first current information may include the AC component of the inductor current iL1.

In FIG. 24, current mirror circuitry 2002 may be coupled to the linked secondary windings of the TLVR 2102 to generate a representation of the second current information through the linked secondary windings. Using the techniques of FIG. 24, the current iLc through the linked secondary windings of the TLVR generates a voltage K*iLc at the output of the current mirror circuitry 2002, where K is a gain of the iLC and corresponds to a scaling of the current mirror circuitry 1002.

The voltage K*iLc generated at the output of the current mirror circuitry 2002 may be applied to a second circuit 1202, such as including a voltage-controlled voltage source. The voltage from the second circuit 1202 is a reference voltage IREF that may be shared by each phase of the multi-phase TLVR voltage regulator 2102. The reference voltage IREF is the sum of the bias voltage Vbias_dc+v (K*iLc).

As seen in FIG. 24, the voltage-controlled voltage source may be coupled to node ISNS1−, which may be an input to the control circuit 1204, such that the control circuit 1204 receives a second voltage that represents second current information, e.g., a representation of current iLc through the secondary windings of the TLVR 2102. The second current information may include the AC component of the inductor current iLc. The control circuit 1204 may receive and combine the first current information and the second current information to sense a current, such as to determine information about the inductor current iL1 and the current iLc, such as peak current, valley current, and intermediate ripples.

The multi-phase trans-inductor voltage regulators in FIGS. 1 and 2 include single-secondary topology. The techniques of this disclosure are also applicable to dual-secondary and M-secondary multi-phase trans-inductor voltage regulator topologies, as shown and described with respect to FIGS. 25-26.

Figure 25:
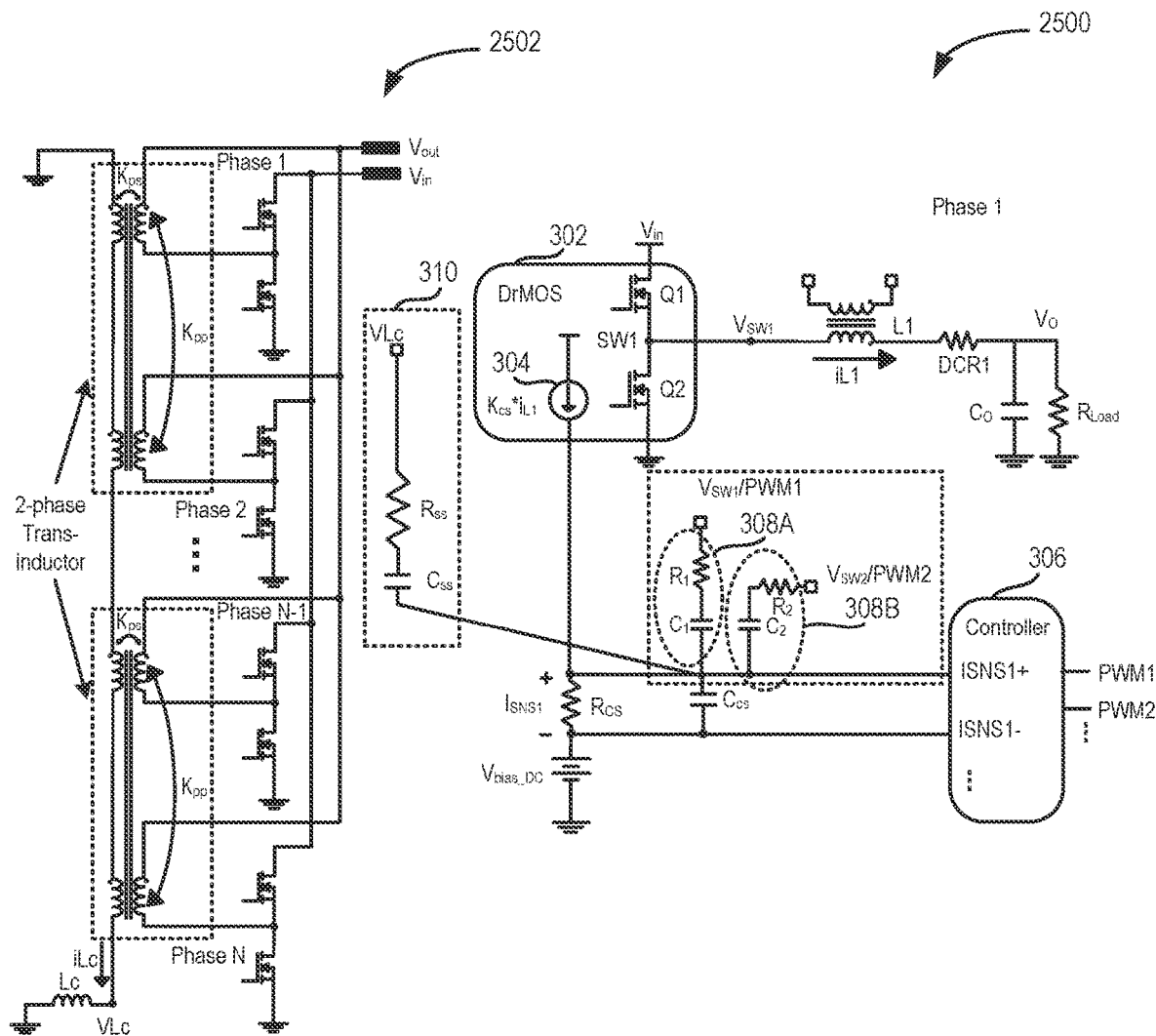
FIG. 25 is an example of a current sensing circuit for use with a dual-secondary TLVR voltage regulator, in accordance with various techniques of this disclosure.

FIG. 25 is an example of a current sensing circuit 2500 for use with a dual-secondary TLVR voltage regulator 2502, in accordance with various techniques of this disclosure. The current sensing circuit 2500 of FIG. 25 may be used along with a power stage assembly 302, such as a driver FET (DrMOS) module, which may be coupled to an input voltage $V_{IN}$, to sense currents of the TLVR 2502. An output voltage $V_O$ is generated across a load having a resistance RLOAD and capacitance $C_O$.

The power stage assembly 302 may include a switching circuit including a first switching element Q1 and a second switching element Q2. A first winding of an inductor L1 may be coupled to a switching node SW1 between the first switching element Q1 and the second switching element Q2. The inductor L1 represents one of the primary windings of the TLVR 100, such as the primary winding 102A in FIG. 1.

The first power stage assembly 302 may also include a signal source 304. The signal source 304 may output a first representation of a current through the inductor L1, where the representation includes a DC component of the current through the inductor L1. For example, the signal source 304 may output a representation of the current through the inductor L1, where the representation is a scaling factor K multiplied by the inductor current $i_{L1}$ through the inductor L1 (K×$i_{L1}$). The DC component of the current is achieved by (K×$i_{L1}$)×$R_{CS}$, with the capacitor C1 acting as a filter for (K×$i_{L1}$)×$R_{CS}$. A control circuit 306, e.g., a multi-phase controller, may receive the representation of the current via a node ISNS1−.

The current sensing circuit 2500 may include a first circuit 308A coupled to either the switching node SW1 or to the output node PWM1 of the control circuit 306. The first circuit 308A may be a passive network including resistor R1 and capacitor C1, which are coupled in series. The first circuit 308A may be coupled to node ISNS1+, which may be an input to the control circuit 306, such that the control circuit 306 receives a first voltage that represents first current information, e.g., a representation of current iL1 through the inductor L1, which is one of the N primary windings of the TLVR 2500. The first current information may include the AC component of the inductor current iL1.

The current sensing circuit 2500 may include a second circuit 308B coupled to either another switching node SW2 or to the output node PWM2 of the control circuit 306. The second circuit 308A may be a passive network including resistor R2 and capacitor C2, which are coupled in series. The second circuit 308B may be coupled to node ISNS1+, which may be an input to the control circuit 306, such that the control circuit 306 receives a second voltage that represents second current information, e.g., a representation of current iL2 through an inductor L2, which is a second one of the N primary windings of the TLVR 2500. The second current information may include the AC component of the inductor current iL2.

The current sensing circuit 300 may include a third circuit 310 coupled to receive the voltage at node VLC, which is coupled to the inductor Lc of the TLVR. The third circuit 310 may be a passive network including resistor RSS and capacitor CSS, which are coupled in series. The third circuit 310 may be coupled to node ISNS1+, which may be an input to the control circuit 306, such that the control circuit 306 receives a third voltage that represents third current information, e.g., a representation of current iLc through the inductor Lc, which is one of the linked secondary windings of the TLVR 2502. The third current information may include the AC component of the inductor current iLc. The control circuit 306 may receive and combine the first current information, the second current information, and the third current information to sense a current, such as to determine information about the inductor current iL1, the inductor current iL2, and the inductor current iLc, such as peak current, valley current, and intermediate ripples.

It should be noted that the current sensing circuit 2500 in FIG. 25 may be used to sense the current for one phase of the multi-phase TLVR voltage regulator 2502. The coupling iLC current information from the secondary side for other phases may be similarly obtained by circuits similar to the first, second, and third circuits 308A, 308B, 310, which may be input into the control circuit 306 using separate inputs.

Figure 26:
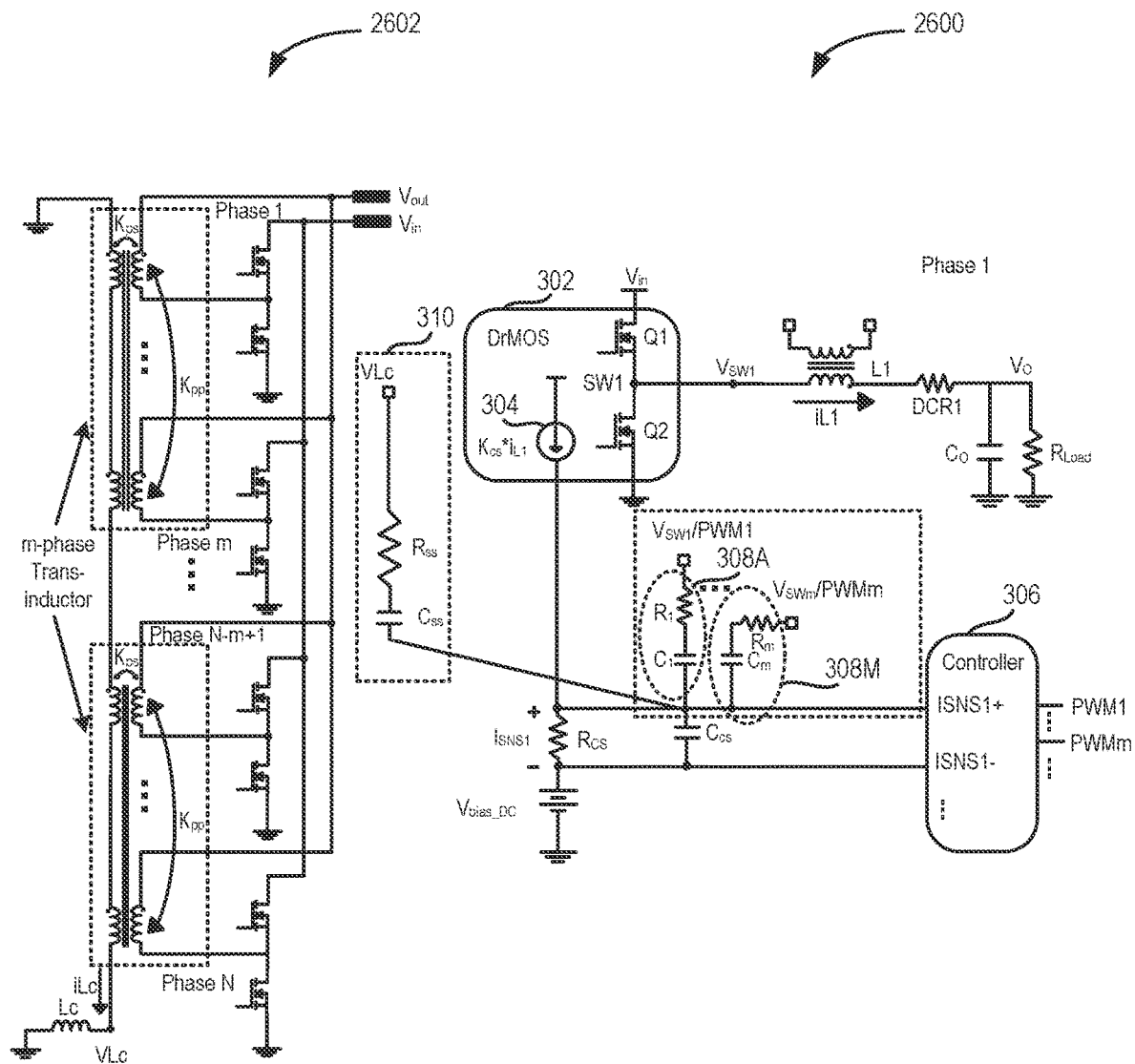
FIG. 26 is an example of a current sensing circuit for use with a M-secondary TLVR voltage regulator, in accordance with various techniques of this disclosure.

FIG. 26 is an example of a current sensing circuit 2600 for use with a M-secondary TLVR voltage regulator 2602, in accordance with various techniques of this disclosure. In FIG. 26, M is greater than or equal to two. Many of the components in FIG. 26 are similar to those in FIG. 25 and, for purposes of conciseness, will not be described in detail.

The current sensing circuit 2600 may include a first circuit 308A coupled to either the switching node SW1 or to the output node PWM1 of the control circuit 306. The first circuit 308A may be a passive network including resistor R1 and capacitor C1, which are coupled in series. The first circuit 308A may be coupled to node ISNS1+, which may be an input to the control circuit 306, such that the control circuit 306 receives a first voltage that represents first current information, e.g., a representation of current iL1 through the inductor L1, which is one of the N primary windings of the TLVR 2602. The first current information may include the AC component of the inductor current iL1.

The current sensing circuit 2600 may include a number of second circuits, such as second circuit 308M, coupled to either another switching node SWM or to the output node PWMM of the control circuit 306. The second circuit 308M may be a passive network including resistor RM and capacitor CM, which are coupled in series. The second circuit 308M may be coupled to node ISNS1+, which may be an input to the control circuit 306, such that the control circuit 306 receives a second voltage that represents second current information, e.g., a representation of current iL2 through an inductor L2, which is a second one of the N primary windings of the TLVR 2602. The second current information may include the AC component of the inductor currents of iL2 to iLM.

The current sensing circuit 300 may include a third circuit 310 coupled to receive the voltage at node VLC, which is coupled to the inductor Lc of the TLVR. The third circuit 310 may be a passive network including resistor RSS and capacitor CSS, which are coupled in series. The third circuit 310 may be coupled to node ISNS1+, which may be an input to the control circuit 306, such that the control circuit 306 receives a third voltage that represents third current information, e.g., a representation of current iLc through the inductor Lc, which is one of the linked secondary windings of the TLVR 2602. The third current information may include the AC component of the inductor current iLc. The control circuit 306 may receive and combine the first current information, the second current information, and the third current information to sense a current, such as to determine information about the inductor current iL1, the inductor currents of iL2 to iLM, and the inductor current iLc, such as peak current, valley current, and intermediate ripples. It should be noted that the current sensing circuit 300 in FIG. 3 may be used to sense the current for one phase of the multi-phase TLVR voltage regulator 2602. The coupling iLC current information from the secondary side for other phases may be similarly obtained by circuits similar to the first, second, and third circuits 308A, 308M, 310, which may be input into the control circuit 306 using separate inputs.

It should be noted that the current sensing circuit 2600 in FIG. 26 may be used to sense the current for one phase of the multi-phase TLVR voltage regulator 2602. The coupling iLC current information from the secondary side for other phases, such as up to phase N−1 and N, as shown, may be similarly obtained by circuits similar to the first, second, and third circuits 308A, 308M, 310, which may be input into the control circuit 306 using separate inputs.

Various Notes

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following aspects, the terms "including" and "comprising" are open-ended, that is, a system, device, article, composition, formulation, or process that includes elements in addition to those listed after such a term in an aspect are still deemed to fall within the scope of that aspect. Moreover, in the following aspects, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the aspects. Also, in the above Detailed Description, various features may be grouped together to streamline the disclosure. This should not be interpreted as intending that an unclaimed disclosed feature is essential to any aspect. Rather, inventive subject matter may lie in less than all features of a particular disclosed embodiment. Thus, the following aspects are hereby incorporated into the Detailed Description as examples or embodiments, with each aspect standing on its own as a separate embodiment, and it is contemplated that such embodiments may be combined with each other in various combinations or permutations. The scope of the invention should be determined with reference to the appended aspects, along with the full scope of equivalents to which such aspects are entitled.

The claimed invention is:

1. A current sensing circuit for use with an N-phase trans-inductor voltage regulator including N primary windings and linked N secondary windings, wherein N is greater than zero, the current sensing circuit of each phase comprising:

a first circuit coupled to a first node, the first circuit configured to receive a first voltage that represents first current information through one of the N primary windings;

a first resistor coupled in series with a first capacitor to form the first circuit, wherein the first circuit is coupled to a switching node or to an output of a controller;
a second circuit coupled to a second node, the second circuit configured to receive a second voltage that represents second current information through the linked N secondary windings, wherein the second current information represents combined AC current information through the linked N secondary windings;
a second resistor coupled in series with a second capacitor to form the second circuit, wherein the second circuit is coupled to a third node, wherein the third node is coupled to the linked secondary windings, wherein the second circuit is not coupled to a switching node; and
a control circuit to combine the first current information and the second current information to sense a current of each phase.

2. The current sensing circuit of claim 1, wherein the first node and the second node are the same node, and wherein
the second resistor coupled in series with a plurality of parallel-connected second capacitors to form the second circuit.

3. The current sensing circuit of claim 1, wherein the first node and the second node are the same node, and wherein
the second capacitor coupled in series with a plurality of parallel-connected second resistors to form the second circuit.

4. The current sensing circuit of claim 1, wherein the linked secondary windings includes a primary winding of a transformer, the current sensing circuit comprising:
the second circuit coupled to a third node, wherein the third node is coupled to a secondary winding of the transformer.

5. The current sensing circuit of claim 1, wherein the linked secondary windings include a discrete inductor.

6. The current sensing circuit of claim 1, wherein the linked secondary windings include a transformer.

7. The current sensing circuit of claim 1, wherein the N-phase trans-inductor voltage regulator is an M-secondary N-phase trans-inductor voltage regulator, where M is greater than or equal to 2.

8. The current sensing circuit of claim 1, wherein the N-phase trans-inductor voltage regulator is a single-secondary N-phase trans-inductor voltage regulator.

9. A method of sensing current in an N-phase trans-inductor voltage regulator, the N-phase trans-inductor voltage regulator including N primary windings and linked N secondary windings, wherein N is greater than zero, the method comprising:
coupling a first resistor in series with a first capacitor to form a first circuit;
coupling the first circuit to a switching node or to an output of a controller;
receiving, using a first circuit coupled to a first node, a first voltage that represents first current information through one of the N primary windings;
coupling a second resistor in series with a second capacitor to form the second circuit;
coupling the second circuit to a third node, wherein the third node is coupled to the linked N secondary windings, wherein the second circuit is not coupled to a switching node;
receiving, using a second circuit coupled to a second node, a second voltage that represents second current information through the linked N secondary winding, wherein the first node and the second node are the same node, and wherein the second current information represents combined AC current information through the linked N secondary windings; and
combining the first current information and the second current information to sense a current of each phase.

10. A current sensing circuit for use with an N-phase trans-inductor voltage regulator including N primary windings and linked secondary windings, wherein N is greater than zero, the current sensing circuit of each phase comprising:
a first circuit coupled to a first node, the first circuit configured to receive a first voltage that represents first current information through one of the N primary windings;
a first resistor coupled in series with a first capacitor to form the first circuit, wherein the first circuit is coupled to a switching node or to an output of a controller;
a second circuit coupled to a second node, the second circuit configured to receive a second voltage that represents second current information through the linked N secondary windings, wherein the second current information represents combined AC current information through the linked N secondary windings, wherein the first node and the second node are different nodes, wherein the second circuit includes a voltage-controlled voltage source; and
a control circuit to combine the first current information and the second current information to sense a current of each phase.

11. The current sensing circuit of claim 10, wherein the second circuit is coupled to a third node, and wherein the third node is coupled to the linked secondary windings, the current sensing circuit comprising:
an RC network coupled to the voltage-controlled voltage source to form the second circuit.

12. The current sensing circuit of claim 10, the current sensing circuit comprising:
a current sense resistor coupled in series with the linked secondary windings,
wherein a voltage across the current sense resistor is applied to the voltage-controlled voltage source.

13. The current sensing circuit of claim 10, the current sensing circuit comprising:
an RC network coupled in parallel with the linked secondary windings,
wherein a voltage across a capacitor of the RC network is applied to the voltage-controlled voltage source.

14. The current sensing circuit of claim 10, wherein the linked secondary windings includes a primary winding of a transformer, the current sensing circuit comprising:
a second resistor coupled to a secondary winding of the transformer,
wherein a voltage across the second resistor coupled to the secondary winding of the transformer is applied to the voltage-controlled voltage source.

15. The current sensing circuit of claim 10, the current sensing circuit comprising:
current mirror circuitry coupled to the linked secondary windings to generate a representation of the second current information through the linked secondary windings,
wherein the representation of the second current information is applied to the voltage-controlled voltage source.

16. A current sensing circuit for use with an N-phase trans-inductor voltage regulator including N primary windings and linked N secondary windings, wherein N is greater than zero, the current sensing circuit of each phase comprising:

a first circuit coupled to a first node, the first circuit configured to receive a first voltage that represents first current information through one of the N primary windings;

a first capacitor coupled to the first node and a second node and a first resistor coupled to a switching node and the first capacitor, wherein the first resistor and the first capacitor form the first circuit;

a second circuit coupled to the second node, the second circuit configured to receive a second voltage that represents second current information through the linked N secondary windings, wherein the second current information represents combined AC current information through the linked N secondary windings, wherein the first node and the second node are different nodes, wherein the second circuit is coupled to a third node, and wherein the third node is coupled to the linked secondary windings;

a second resistor coupled in series with a second capacitor to form the second circuit; and a control circuit to combine the first current information and the second current information to sense a current of each phase.

17. The current sensing circuit of claim 16, wherein the second resistor is coupled in series with a plurality of parallel-connected second capacitors to form the second circuit.

18. The current sensing circuit of claim 16, wherein the second capacitor is coupled in series with a plurality of parallel-connected second resistors to form the second circuit.

19. A current sensing circuit for use with an N-phase trans-inductor voltage regulator including N primary windings and linked N secondary windings, wherein N is greater than zero, the current sensing circuit of each phase comprising:

a first circuit coupled to a first node, the first circuit configured to receive a first voltage that represents first current information through one of the N primary windings;

a first capacitor coupled to the first node and a second node and a first resistor coupled to a switching node and the first capacitor, wherein the first resistor and the first capacitor form the first circuit;

a second circuit coupled to the second node, the second circuit configured to receive a second voltage that represents second current information through the linked N secondary windings, wherein the second current information represents combined AC current information through the linked N secondary windings, wherein the first node and the second node are different nodes, and wherein the second circuit includes a voltage-controlled voltage source; and a control circuit to combine the first current information and the second current information to sense a current of each phase.

20. The current sensing circuit of claim 19, comprising:
an RC network coupled to the voltage-controller voltage source to form the second circuit,
the second circuit coupled to a third node, wherein the third node is coupled to the linked secondary windings.

21. The current sensing circuit of claim 19, wherein the linked secondary windings include a transformer having a primary winding and a secondary winding, the current sensing circuit comprising:
an RC network coupled to the voltage-controller voltage source to form the second circuit; and
the second circuit coupled to a third node, wherein the third node is coupled to the secondary winding of the transformer.

22. The current sensing circuit of claim 19, wherein the first node and the second node are different nodes, the current sensing circuit comprising:
a current sense resistor coupled in series with the linked secondary windings,
wherein a voltage across the current sense resistor is applied to the voltage-controlled voltage source.

23. The current sensing circuit of claim 19, comprising:
an RC network coupled in parallel with the secondary winding,
wherein a voltage across a capacitor of the RC network is applied to the voltage-controlled voltage source.

24. The current sensing circuit of claim 19, wherein the linked secondary windings include a primary winding of a transformer, the current sensing circuit comprising:
a second resistor coupled to a secondary winding of the transformer,
wherein a voltage across the second resistor coupled to the secondary winding of the transformer is applied to the voltage-controlled voltage source.

25. The current sensing circuit of claim 19, comprising:
current mirror circuitry coupled to the linked secondary windings to generate a representation of the second current information through the secondary winding,
wherein the representation of the second current information is applied to the voltage-controlled voltage source.

* * * * *